US012777763B2

(12) United States Patent
Song et al.

(10) Patent No.: US 12,777,763 B2
(45) Date of Patent: Oct. 27, 2026

(54) DISPLAY DEVICE AND METHOD OF MANUFACTURING THE SAME

(71) Applicant: Samsung Display Co., LTD., Yongin-si (KR)

(72) Inventors: Myeong Hun Song, Yongin-si (KR); Je Min Lee, Yongin-si (KR); Eun Je Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 791 days.

(21) Appl. No.: 18/147,519

(22) Filed: Dec. 28, 2022

(65) Prior Publication Data

US 2023/0290807 A1 Sep. 14, 2023

(30) Foreign Application Priority Data

Mar. 8, 2022 (KR) ........................ 10-2022-0029639

(51) Int. Cl.
*H10H 20/84* (2025.01)
*H10H 20/01* (2025.01)
(Continued)

(52) U.S. Cl.
CPC .......... *H10H 29/142* (2025.01); *H10H 20/01* (2025.01); *H10H 20/821* (2025.01); *H10H 20/84* (2025.01)

(58) Field of Classification Search
CPC .... H10H 29/142; H10H 20/01; H10H 20/821; H10H 20/84; H10H 20/857;
(Continued)

(56) References Cited

U.S. PATENT DOCUMENTS 6,690,033 B2 * 2/2004 Yamazaki ............ H10D 86/441
349/110
2020/0403131 A1 12/2020 Kim et al.
(Continued)

FOREIGN PATENT DOCUMENTS

CN 110400819 A * 11/2019 ............... G09G 3/32
JP 2003188463 A * 7/2003
(Continued)

OTHER PUBLICATIONS

Korean Notice of Allowance issued Aug. 1, 2025, in corresponding Korean Patent Application No. 10-2022-0029639 (6 pages).
(Continued)

*Primary Examiner* — Monica D Harrison
(74) *Attorney, Agent, or Firm* — Womble Bond Dickinson (US) LLP

(57) ABSTRACT

A display device and a method manufacturing the same are disclosed. The display device includes a substrate including an emission area and a non-emission area, a first connection electrode provided on the substrate and electrically connected to a first driving power, a second connection electrode provided to be spaced apart from the first connection electrode in a first direction and electrically connected to a second driving power, a dummy electrode provided to be spaced apart from the first connection electrode in a second direction intersecting the first direction, light emitting elements provided between the second connection electrode and the dummy electrode in a plan view and forming the emission area, a first pixel electrode provided on the first connection electrode and the dummy electrode and electrically connected to the first connection electrode, and a second pixel electrode provided on the second connection electrode and electrically connected to the second connection electrode.

17 Claims, 10 Drawing Sheets

(51) Int. Cl.
*H10H 20/821* (2025.01)
*H10H 29/14* (2025.01)

(58) Field of Classification Search
CPC .............. H10H 20/0364; H10H 20/819; H01L 25/167; H01L 25/0753; H10K 50/805; H10K 59/124; H10K 59/131; H10K 59/86; H10K 71/00; H10W 90/00
See application file for complete search history.

(56) References Cited

U.S. PATENT DOCUMENTS

| | | | | |
|---|---|---|---|---|
| 2020/0403176 | A1* | 12/2020 | Gunji | H05B 33/12 |
| 2021/0408493 | A1* | 12/2021 | Shen | H10K 59/131 |

FOREIGN PATENT DOCUMENTS

| | | | | | |
|---|---|---|---|---|---|
| KR | 10-2004-0102654 | A | | 12/2004 | |
| KR | 10-2016-0119923 | A | | 10/2016 | |
| KR | 10-2016-0147113 | A | | 12/2016 | |
| KR | 10-2017-0113932 | A | | 10/2017 | |
| KR | 20190141510 | A | * | 12/2019 | G02F 1/136286 |
| KR | 20200088962 | A | * | 7/2020 | H10W 90/00 |
| KR | 10-2020-0145966 | A | | 12/2020 | |
| KR | 10-2021-0042197 | A | | 4/2021 | |
| KR | 10-2021-0103602 | A | | 8/2021 | |
| KR | 10-2021-0132260 | A | | 11/2021 | |

OTHER PUBLICATIONS

Lu, Han et al., "Large-Area and Patternable Nano-Dot Array from Electrolysis of ITO Film for Surface-Enhanced Raman Spectroscopy", Nanoscale Research Letters (2020) 15:8, 13; https://doi.org/10.1186/s11671-019-3239-9 (10 pages).

* cited by examiner

DISPLAY DEVICE AND METHOD OF MANUFACTURING THE SAME

CROSS-REFERENCE TO RELATED APPLICATION

This application claims priority to and the benefit of Korean Patent Application No. 10-2022-0029639, filed on, Mar. 8, 2022, in the Korean Intellectual Property Office, the entire content of which is herein incorporated by reference.

BACKGROUND

1. Field

One or more embodiments of the present disclosure relate to a pixel, a display device including the same, and a method of manufacturing the same.

2. Description of the Related Art

Importance of a display device is increasing with development of multimedia. In response to this, various types (or kinds) of display devices such as a liquid crystal display (LCD) and an organic light emitting display (OLED) are being developed and used.

As interest in information display increases and demand to use portable information media increases, demand and commercialization for a display device are brought more into focus.

SUMMARY

Various particles (e.g., impurities) that are electrically connected to light emitting elements provided in a pixel may penetrate into a pixel electrode forming an electrode and may cause a galvanic reaction. The galvanic reaction occurring in the pixel electrode may cause a dark spot and a short circuit, which may cause deterioration of image quality of a display device. In order to improve quality deterioration of the display device due to the occurrence of the dark spot and the short circuit, a display device capable of reducing the penetration of particles into the pixel electrode electrically connected to the light emitting element is requested or desired.

In addition, as the pixel electrode has a potential (e.g., voltage) lower than a potential (e.g., voltage) of an electrode adjacent to the pixel electrode, the galvanic reaction may be accelerated. Therefore, a display device having a structure for preventing or reducing the acceleration of the galvanic reaction according to a potential difference with the adjacent electrode is requested or desired.

One or more embodiments of the present disclosure are directed toward a display device for improving occurrence of a dark spot defect and reducing the risk of a short circuit.

One or more other embodiments of the disclosure are directed toward a method of manufacturing a display device for improving occurrence of a dark spot defect and reducing the risk of a short circuit.

However, embodiments of the disclosure are not limited to the above-described objects, and may be variously suitably expanded in a range without departing from the spirit and scope of the disclosure.

According to one or more embodiments of the disclosure, a display device may include a substrate including an emission area and a non-emission area, a first connection electrode provided on the substrate and electrically connected to a first driving power, a second connection electrode provided to be spaced apart from the first connection electrode in a first direction and electrically connected to a second driving power, a dummy electrode provided to be spaced apart from the first connection electrode in a second direction crossing (e.g., intersecting) the first direction, light emitting elements provided between the second connection electrode and the dummy electrode in a plan view, the light emitting elements forming the emission area, a first pixel electrode provided on the first connection electrode and the dummy electrode and electrically connected to the first connection electrode, and a second pixel electrode provided on the second connection electrode and electrically connected to the second connection electrode.

According to one or more embodiments, the light emitting elements may not overlap the first connection electrode.

According to one or more embodiments, the first connection electrode may be provided in the non-emission area of the substrate.

According to one or more embodiments, the first connection electrode, the second connection electrode, and the dummy electrode may be provided on the same layer.

According to one or more embodiments, the dummy electrode may overlap the first pixel electrode and may not be electrically connected to the first pixel electrode or the second pixel electrode.

According to one or more embodiments, a cross-sectional area of the dummy electrode in a direction perpendicular to a light emission direction of the light emitting element may be greater than a cross-sectional area of the first connection electrode in the same direction.

According to one or more embodiments, the display device may further include an intermediate electrode provided to be spaced apart from the first pixel electrode and the second pixel electrode.

According to one or more embodiments, the dummy electrode may overlap the first pixel electrode and the intermediate electrode.

According to one or more embodiments, the first pixel electrode, the second pixel electrode, and the intermediate electrode may be provided on the same layer.

According to one or more embodiments, the intermediate electrode may surround a portion of the first pixel electrode in a plan view.

According to one or more embodiments, the light emitting elements may include first light emitting elements and second light emitting elements, the first light emitting elements being connected to the second light emitting elements in series.

According to one or more embodiments, a first end of the first light emitting elements may be in contact with the first pixel electrode, a second end of the first light emitting elements may be in contact with the intermediate electrode, a first end of the second light emitting elements may be in contact with the intermediate electrode, and a second end of the second light emitting elements may be in contact with the second pixel electrode.

According to one or more embodiments, the display device may further include an insulating layer provided between the first and second pixel electrodes, and between the first and second connection electrodes, and the first pixel electrode and the first connection electrode may be electrically connected to each other through a first contact hole formed in the insulating layer.

According to one or more embodiments, the second pixel electrode and the second connection electrode may be electrically connected to each other through a second contact hole formed in the insulating layer.

According to one or more embodiments, the display device may further include a conductive layer including the first connection electrode, the second connection electrode, and the dummy electrode, and a via layer provided between the conductive layer and the substrate, and the first connection electrode may be electrically connected to a first power line configured to provide a voltage of the first driving power through a first via hole formed in the via layer.

According to one or more embodiments, the second connection electrode may be electrically connected to a second power line configured to provide a voltage of the second driving power through a second via hole formed in the via layer.

According to one or more embodiments, the first power line may extend in the second direction, and the second power line may extend in the first direction in the non-emission area.

According to various embodiments of the disclosure, a method of manufacturing a display device may include forming a first alignment electrode provided with a first alignment signal and a second alignment electrode provided with a second alignment signal, the first alignment electrode and the second alignment electrode being spaced apart from each other on a substrate, forming a first insulating layer on the first and second alignment electrodes, disposing and aligning light emitting elements on the first alignment electrode and the second alignment electrode, separating the first alignment electrode into a first connection electrode and a dummy electrode by removing a portion of the first alignment electrode, and forming a first pixel electrode and a second pixel electrode spaced apart from each other on the light emitting elements to be electrically connected to the light emitting elements, respectively.

According to one or more embodiments, separating the first alignment electrode into the first connection electrode and the dummy electrode may include removing the portion of the first alignment electrode by irradiating laser light to the first alignment electrode.

According to one or more embodiments, the light emitting elements may not overlap the first connection electrode.

In accordance with the display device and the method of manufacturing the same according to embodiments of the disclosure, a particle (e.g., impurity) flowing into a pixel electrode layer may be prevented or reduced, thereby providing excellent or improved image quality.

However, an effect of the disclosure is not limited to the above-described effect, and may be variously expanded in a range without departing from the spirit and scope of the disclosure.

BRIEF DESCRIPTION OF THE DRAWINGS

The above and other features of the disclosure will become more apparent by describing in further detail embodiments thereof with reference to the accompanying drawings, in which.

DETAILED DESCRIPTION

Figure 1:
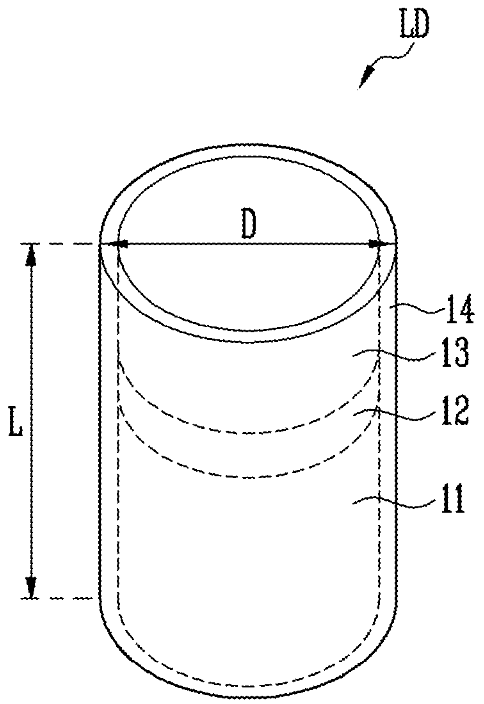
FIG. 1 is a perspective view schematically illustrating a light emitting element according to one or more embodiments.

Hereinafter, embodiments of the present disclosure are described in more detail with reference to the accompanying drawings. The same reference numerals are used for the same components in the drawings, and a repeated description of the same component is not provided.

It will be understood that, although the terms first, second, etc. may be used herein to describe various elements, these elements should not be limited by these terms. These terms are only used to distinguish one element from another element. Thus, a first element could be termed a second element without departing from the teachings of the present invention. Similarly, a second element could be termed a first element. As used herein, the singular forms are intended to include the plural forms as well, unless the context clearly indicates otherwise.

As used herein, the singular forms "a," "an," and "the" are intended to include the plural forms as well, unless the context clearly indicates otherwise.

It will be further understood that the terms "includes," "including," "comprises," and/or "comprising," when used in this specification, specify the presence of stated features, steps, operations, elements, and/or components, but do not preclude the presence or addition of one or more other features, steps, operations, elements, components, and/or groups thereof.

As used herein, the terms "use," "using," and "used" may be considered synonymous with the terms "utilize," "utilizing," and "utilized," respectively.

As used herein, expressions such as "at least one of", "one of", and "selected from", when preceding a list of elements, modify the entire list of elements and do not modify the individual elements of the list. For example, "at least one selected from a, b and c", "at least one of a, b or c", and "at least one of a, b and/or c" may indicate only a, only b, only c, both (e.g., simultaneously) a and b, both (e.g., simultaneously) a and c, both (e.g., simultaneously) b and c, all of a, b, and c, or variations thereof.

As used herein, the term "and/or" includes any and all combinations of one or more of the associated listed items.

Further, the use of "may" when describing embodiments of the present disclosure refers to "one or more embodiments of the present disclosure".

It will be understood that when an element is referred to as being "on," "connected to," or "coupled to" another element, it may be directly on, connected, or coupled to the other element or one or more intervening elements may also be present. When an element is referred to as being "directly on," "directly connected to," or "directly coupled to" another element, there are no intervening elements present.

Spatially relative terms, such as "beneath," "below," "lower," "above," "upper," "bottom," "top" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" or "over" the other elements or features. Thus, the term "below" may encompass both an orientation of above and below. The device may be otherwise oriented (rotated 90 degrees or at other orientations), and the spatially relative descriptors used herein should be interpreted accordingly.

As used herein, the terms "substantially", "about", and similar terms are used as terms of approximation and not as terms of degree, and are intended to account for the inherent deviations in measured or calculated values that would be recognized by those of ordinary skill in the art. "About" or "approximately," as used herein, is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within +30%, 20%, 10%, 5% of the stated value.

Any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

The electronic device and/or any other relevant devices or components according to embodiments of the present invention described herein may be implemented utilizing any suitable hardware, firmware (e.g. an application-specific integrated circuit), software, or a combination of software, firmware, and hardware. For example, the various components of the apparatus may be formed on one integrated circuit (IC) chip or on separate IC chips. Further, the various components of the apparatus may be implemented on a flexible printed circuit film, a tape carrier package (TCP), a printed circuit board (PCB), or formed on one substrate. Further, the various components of the apparatus may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the embodiments of the present disclosure.

Figure 2:
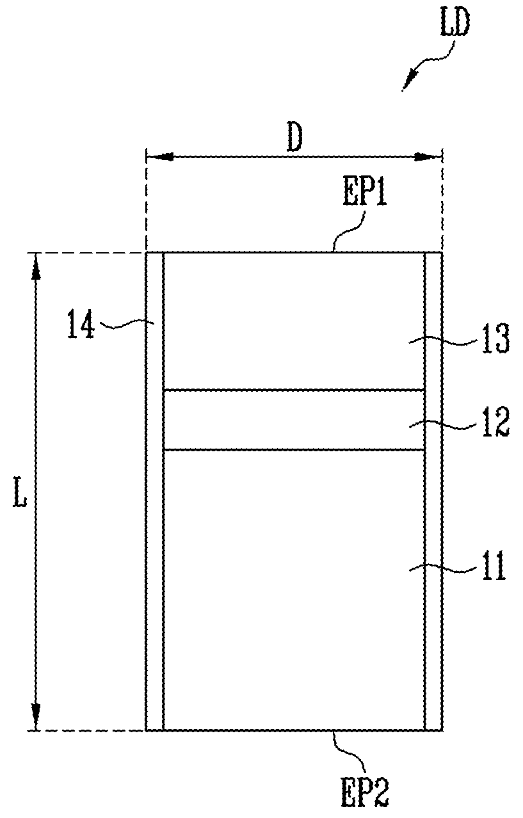
FIG. 2 is a schematic cross-sectional view of the light emitting element of FIG. 1 according to one or more embodiments.

FIG. 1 is a perspective view schematically illustrating a light emitting element LD according to one or more embodiments. FIG. 2 is a schematic cross-sectional view of the light emitting element LD of FIG. 1 according to one or more embodiments.

Referring to FIGS. 1 and 2, a type (or kind) and/or a shape of the light emitting element LD are/is not limited to the embodiments shown in FIGS. 1 and 2.

In one or more embodiments, referring to FIGS. 1 and 2, the light emitting element LD may include a first semiconductor layer 11, a second semiconductor layer 13, and an active layer 12 interposed between the first semiconductor layer 11 and the second semiconductor layer 13. In an example, the light emitting element LD may be implemented as a light emitting stack (or a stack pattern) in which the first semiconductor layer 11, the active layer 12, and the second semiconductor layer 13 are sequentially stacked.

In one or more embodiments, the light emitting element LD may be provided in a shape extending in one direction. When an extension direction of the light emitting element LD is referred to as a length direction, the light emitting element LD may include a first end EP1 and a second end EP2 facing each other along the length direction. One semiconductor layer selected from the first semiconductor layer 11 and the second semiconductor layer 13 may be provided at the first end EP1 of the light emitting element LD, and a remaining semiconductor layer selected from the first semiconductor layer 11 and the second semiconductor layer 13 may be provided at the second end EP2 of the light emitting element LD. For example, the second semiconductor layer 13 may be provided at the first end EP1, and the first semiconductor layer 11 may be provided at the second end EP2.

In one or more embodiments, the light emitting element LD may have one or more suitable shapes. In an example, the light emitting element LD may have a rod type shape (e.g., rod shape), a bar type shape (e.g., bar shape), and/or a pillar type shape (e.g., pillar shape) long (or having an aspect ratio greater than 1) in the length direction as shown in FIG. 1. In some embodiments, the light emitting element LD may have a rod type shape, a bar type shape, or a pillar type shape short (or having an aspect ratio less than 1) in the length direction.

In one or more embodiments, the light emitting element LD may have a diameter D and/or a length L of a nano scale (or a nanometer) or a micro scale (or a micrometer). The light emitting element LD may include a light emitting diode (LED) manufactured in a miniature size. For example, when the light emitting element LD is long in the length direction, the diameter D of the light emitting element LD may be about 0.5 μm to 6 μm, and the length L may be about 1 μm to 10 μm. However, the diameter D and the length L of the light emitting element LD are not limited thereto, and a size of the light emitting element LD may be variable suitably changed so as to meet a requirement (or a design condition) of a lighting device or a self-luminous display device to which the light emitting element LD is applied.

In one or more embodiments, the first semiconductor layer 11 may include at least one n-type semiconductor layer. For example, the first semiconductor layer 11 may include any one semiconductor material selected from among InAlGaN, GaN, AlGaN, InGaN, AlN, and InN. The first semiconductor layer 11 may be an n-type semiconductor layer doped with a first conductive dopant (or an n-type dopant), such as silicon (Si), germanium (Ge), and/or tin (Sn). However, a material configuring the first semiconductor layer 11 is not limited thereto, and may include various other suitable materials. The first semiconductor layer 11 may include a first surface that is in contact with the active layer 12 and a second surface exposed to the outside along the length direction of the light emitting element LD.

In one or more embodiments, the active layer 12 may be provided on the first semiconductor layer 11 and may be formed in a single or multiple quantum well structure. In an example, when the active layer 12 is formed in the multiple quantum well structure, the active layer 12 may be formed by periodically and repeatedly stacking a barrier layer, a strain reinforcing layer, and a well layer as one unit. The strain reinforcing layer may have a lattice constant smaller than that of the barrier layer, and apply a compressive strain to the well layer. However, a structure of the active layer 12 is not limited to the above-described embodiment.

In one or more embodiments, the active layer 12 may emit light having a wavelength of about 400 nm to 900 nm. The active layer 12 may use a double hetero structure. In an example, a clad layer doped with a conductive dopant may be formed on and/or under the active layer 12 in the length direction of the light emitting element LD. In an example, the clad layer may be formed of an AlGaN layer and/or an InAlGaN layer. A material of AlGaN and/or InAlGaN may be used to form the active layer 12, and one or more other suitable materials may be included in the active layer 12. The active layer 12 may include a first surface that is in contact with the first semiconductor layer 11 and a second surface that is in contact with the second semiconductor layer 13.

In one or more embodiments, when an electric field greater than a set or predetermined voltage is applied to both ends of the light emitting element LD, the light emitting element LD emits light while an electron-hole pair is recombined in the active layer 12. The light emitting element LD may be used as a light source (or a light emitting source) of the display device.

In one or more embodiments, the second semiconductor layer 13 may be provided on the second surface of the active layer 12, and may include a semiconductor layer of a type (or kind) different from that of the first semiconductor layer 11. For example, the second semiconductor layer 13 may include at least one p-type semiconductor layer. For example, the second semiconductor layer 13 may include at least one semiconductor material selected from among InAlGaN, GaN, AlGaN, InGaN, AlN, and InN, and may include a p-type semiconductor layer doped with a second conductive dopant (or a p-type dopant) such as magnesium (Mg), zinc (Zn), calcium (Ca), strontium (Sr), and/or barium (Ba). However, the second semiconductor layer 13 is not limited thereto, and may include one or more other suitable materials. The second semiconductor layer 13 may include a first surface that is in contact with the second surface of the active layer 12 along the length direction of the light emitting element LD and a second surface exposed to the outside.

In one or more embodiments, the first semiconductor layer 11 and the second semiconductor layer 13 may have different thicknesses in the length direction of the light emitting element LD. For example, the first semiconductor layer 11 may have a thickness relatively greater than that of the second semiconductor layer 13 in the length direction of the light emitting element LD. The active layer 12 of the light emitting element LD may be positioned to be closer to an upper surface of the second semiconductor layer 13 than to a lower surface of the first semiconductor layer 11.

In one or more embodiments, each of the first semiconductor layer 11 and the second semiconductor layer 13 is configured of one layer, but the disclosure is not limited thereto. For example, the first semiconductor layer 11 and the second semiconductor layer 13 may each independently further include one or more layers according to a material configuring the active layer 12. For example, the first semiconductor layer 11 and the second semiconductor layer 13 may each independently further include a clad layer and/or a tensile strain barrier reducing (TSBR) layer. The TSBR layer may be a strain relief layer provided between semiconductor layers to reduce a lattice constant difference and serving as a buffer. The TSBR layer may be configured of a p-type semiconductor layer such as p-GaInP, p-AlInP, and/or p-AlGaInP, but is not limited thereto.

In one or more embodiments, the light emitting element LD may further include a contact electrode (hereinafter referred to as a 'first contact electrode') provided on the second semiconductor layer 13, in addition to the first semiconductor layer 11, the active layer 12, and the second semiconductor layer 13. In some embodiments, another contact electrode (hereinafter referred to as a 'second contact electrode') provided on one end of the first semiconductor layer 11 may be further included.

In one or more embodiments, the first contact electrode and the second contact electrode may be an ohmic contact electrode, but the disclosure is not limited thereto. For example, the first contact electrode and the second contact electrode may include a Schottky electrode. The first contact electrode and the second contact electrode may include conductive materials. For example, the first contact electrode and the second contact electrode may include an opaque containing-metal material using chromium (Cr), titanium (Ti), aluminum (Al), gold (Au), nickel (Ni), an oxide thereof, an alloy thereof, and/or the like alone or in combination, but is not limited thereto. For example, the first contact electrode and the second contact electrode may include a transparent conductive oxide such as indium tin oxide (ITO), indium zinc oxide (IZO), zinc oxide ($ZnO_x$), indium gallium zinc oxide (IGZO), and/or indium tin zinc oxide (ITZO). Here, the zinc oxide ($ZnO_x$) may be zinc oxide (ZnO).

In one or more embodiments, materials included in the first contact electrode and the second contact electrode may be identical to or different from each other. The first contact electrode and the second contact electrode may be substantially transparent or translucent. Light generated from the light emitting element LD may pass through each of the first contact electrode and the second contact electrode to be emitted to the outside of the light emitting element LD. In one or more embodiments, the first contact electrode and the second contact electrode may include opaque metals, and the light generated by the light emitting element LD may be emitted to the outside of the light emitting element LD through an area excluding the both ends of the light emitting element LD without passing through the first contact electrode and the second contact electrode.

In one or more embodiments, the light emitting element LD may further include an insulating layer 14. In some embodiments, the insulating layer 14 may not be provided, or may be provided to cover at least a portion of the first semiconductor layer 11, the active layer 12, and the second semiconductor layer 13.

In one or more embodiments, the insulating layer 14 may prevent or reduce the risk of an electrical short circuit that may occur when the active layer 12 comes into contact with a conductive material other than the first semiconductor layer 11 and the second semiconductor layer 13. The insulating layer 14 may minimize or reduce a surface defect of the light emitting element LD, thereby improving a lifetime and light emission efficiency of the light emitting element LD. When a plurality of light emitting elements LD are provided closely (e.g., suitably close) to each other, the insulating layer 14 may prevent or reduce the risk of an undesirable short circuit between the light emitting elements LD.

In some embodiments, the insulating layer 14 may entirely surround an outer circumferential surface of the light emitting stack including the first semiconductor layer 11, the active layer 12, and the second semiconductor layer 13.

In one or more embodiments, when the light emitting element LD includes the first contact electrode, the insulating layer 14 may entirely surround outer circumferential surfaces of each of the first semiconductor layer 11, the active layer 12, the second semiconductor layer 13, and the first contact electrode. However, the disclosure is not limited thereto, and the insulating layer 14 may not entirely surround the outer peripheral surface of the first contact electrode. When the first contact electrode is provided at the first end EP1 of the light emitting element LD and the second contact electrode is provided at the second end EP2 of the light emitting element LD, the insulating layer 14 may expose at least one area of each of the first contact electrode and the second contact electrode.

In one or more embodiments, the insulating layer 14 may include a transparent insulating material. For example, the insulating layer 14 may include at least one insulating material selected from a group consisting of silicon oxide ($SiO_x$), silicon nitride ($SiN_x$), silicon oxynitride ($SiO_xN_y$), aluminum oxide ($AlO_x$), titanium oxide ($TiO_x$), hafnium oxide ($HfO_x$), titanium strontium oxide ($SrTiO_x$), cobalt oxide ($Co_xO_y$), magnesium oxide (MgO), zinc oxide ($ZnO_x$), rucenium oxide ($RuO_x$), nickel oxide (NiO), tungsten oxide ($WO_x$), tantalum oxide ($TaO_x$), gadolinium oxide ($GdO_x$), zirconium oxide ($ZrO_x$), gallium oxide ($GaO_x$), vanadium oxide ($V_xO_y$), ZnO:Al, ZnO:B, InxOy:H, niobium oxide ($Nb_xO_y$), magnesium fluoride ($MgF_x$), aluminum fluoride ($AlF_x$), Alucone polymer film, titanium nitride (TiN), tantalum nitride (TaN), aluminum nitride ($AlN_x$), gallium nitride (GaN), tungsten nitride (WN), hafnium nitride (HfN), niobium nitride (NbN), gadolinium nitride (GdN), zirconium nitride (ZrN), and vanadium nitride (VN), but the disclosure is not limited thereto, and one or more other suitable materials having insulating properties may be used as the material of the insulating layer 14.

In one or more embodiments, the insulating layer 14 may be provided in a form of a single layer or in a form of multiple layers including double layers. For example, when the insulating layer 14 is configured as double layers including a first layer and a second layer sequentially stacked, the first layer and the second layer may be formed of different materials (or substance), and may be formed in (e.g., during) different processes. In some embodiments, the first layer and the second layer may be formed of the same material.

In one or more embodiments, the light emitting element LD may be implemented as a light emitting pattern of a core-shell structure. For example, the first semiconductor layer 11 may be positioned in a core, for example, a center of the light emitting element LD, and the active layer 12 may be formed in a form surrounding the outer circumferential surface of the first semiconductor layer 11. The second semiconductor layer 13 may be formed in a form surrounding the active layer 12. The light emitting element LD may further include a contact electrode surrounding at least one side of the second semiconductor layer 13. For example, the light emitting element LD may further include the insulating layer 14 provided on an outer circumferential surface of the light emitting pattern of the core-shell structure and including a transparent insulating material. The light emitting element LD implemented as the light emitting pattern of the core-shell structure may be manufactured by a growth method.

In one or more embodiments, the light emitting element LD may be manufactured through a surface treatment process. For example, when the light emitting element LD is mixed with a fluid solution and supplied to each pixel area (for example, the emission area of each pixel or the emission area of each sub-pixel), each of the light emitting elements LD may be surface-treated to be substantially uniformly sprayed without being non-uniformly agglomerated in the solution.

In one or more embodiments, a light emitting unit including the light emitting element LD may be used in one or more suitable types (or kinds) of electronic devices such as a display device. For example, when the light emitting element LD is provided in the pixel area of each pixel of a display panel, the light emitting element LD may be used as a light source of each pixel. However, an application field of the light emitting element LD is not limited to the above-described example. For example, the light emitting element LD may be used in other types (or kinds) of electronic devices requiring a light source, such as a lighting device.

Figure 3:
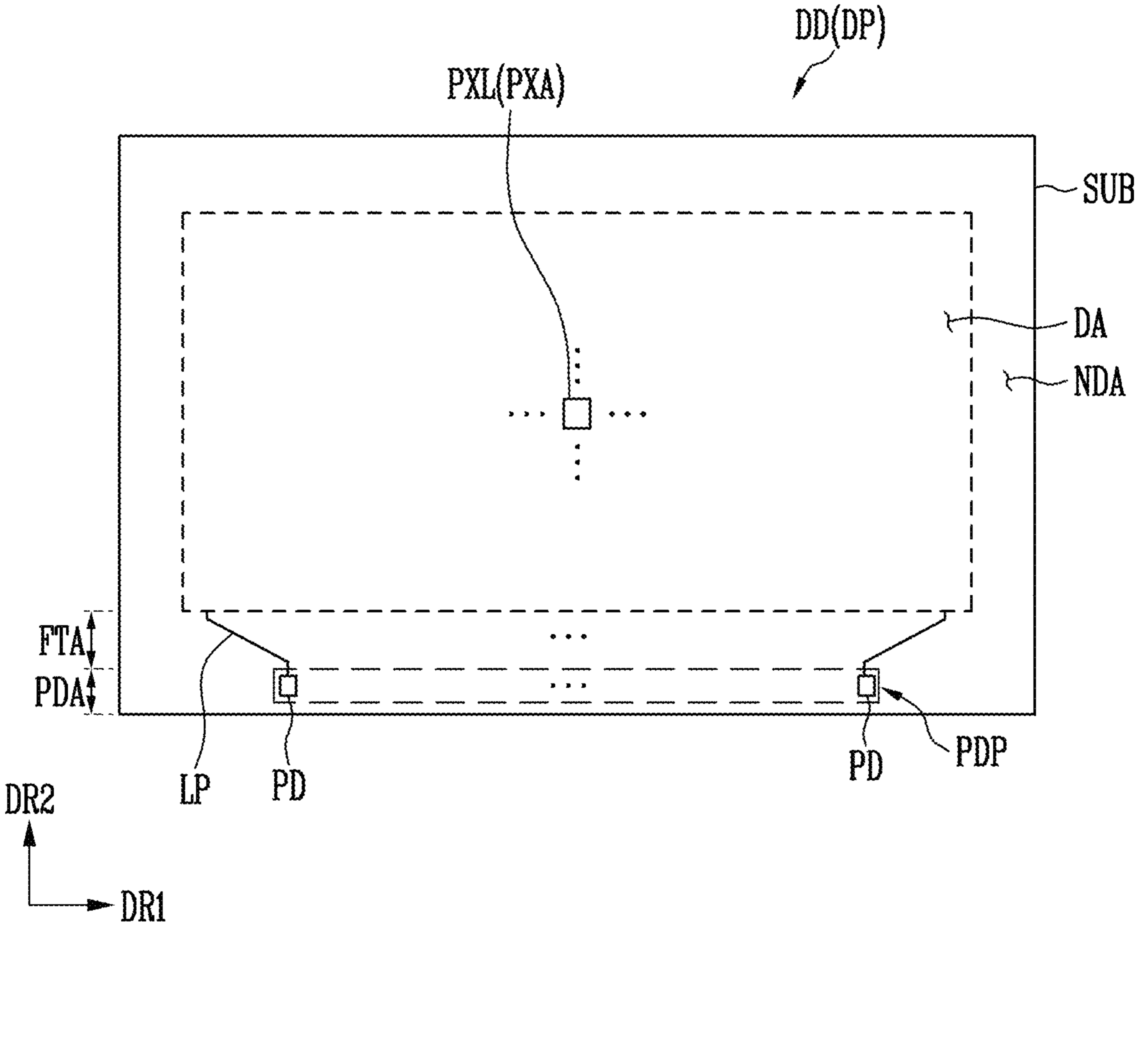
FIG. 3 is a plan view schematically illustrating a display device according to one or more embodiments.
Figure 4:
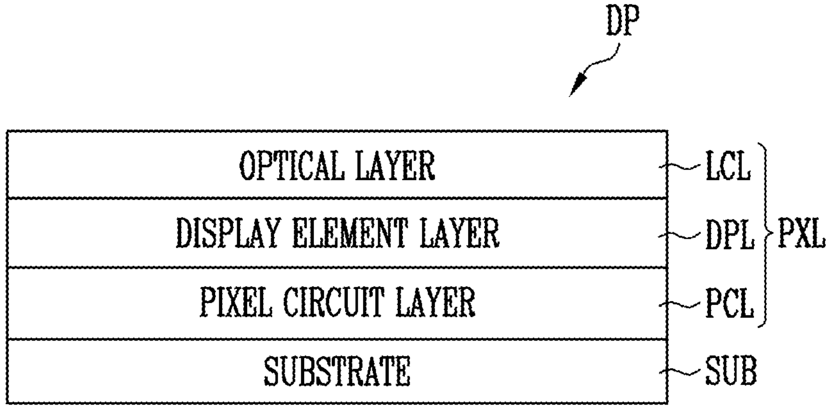
FIG. 4 is a schematic cross-sectional view of a display panel shown in FIG. 3 according to one or more embodiments.

FIG. 3 is a plan view schematically illustrating a display device DD according to one or more embodiments. FIG. 4 is a schematic cross-sectional view of a display panel DP shown in FIG. 3 according to one or more embodiments.

In FIGS. 3 and 4, a structure of the display device DD and the display panel DP provided in the display device DD are schematically shown based on a display area DA on which an image is displayed.

Referring to FIGS. 1 to 4, the display device DD may include a substrate SUB, a pixel PXL provided on the substrate SUB and each including the light emitting element LD, a driver driving the pixel PXL, and a line unit connecting the pixel PXL and the driver.

In one or more embodiments, each pixel PXL may include a driving transistor that controls an amount of current supplied to the light emitting element LD, a switching transistor that transmits a data signal to the driving transistor, and the like.

In one or more embodiments, the display device DD may be provided in one or more suitable shapes. For example, the display device DD may be provided in a rectangular plate shape (where oppositely facing sides are substantially parallel to each other), but is not limited thereto. When the display device DD is provided in the rectangular plate shape, the display device DD may include a pair of long sides and a pair of short sides. An extension direction of the long side is shown as a first direction DR1, and an extension direction of the short side is shown as a second direction DR2. The display device DD may have a round shape at a corner (e.g., a rounded corner) where one long side and one short side contact each other.

In one or more embodiments, the display panel DP may include a substrate SUB, and a pixel circuit layer PCL, a display element layer DPL, and an optical layer LCL sequentially provided on the substrate SUB.

In one or more embodiments, the pixel circuit layer PCL may be provided on the substrate SUB, and a pixel circuit (for example, a pixel circuit PXC of FIG. 5) including a plurality of transistors and signal lines connected to the transistors may be provided. For example, each transistor may have a form in which a semiconductor layer, a gate electrode, a first terminal, and a second terminal are sequentially stacked with an insulating layer interposed therebetween. The semiconductor layer may include amorphous silicon, poly silicon, low temperature poly silicon, an organic semiconductor, and/or an oxide semiconductor. The gate electrode, the first terminal (or a source electrode), and the second terminal (or a drain electrode) may include one or more of aluminum (Al), copper (Cu), titanium (Ti), or molybdenum (Mo), but are not limited thereto. In some embodiments, the pixel circuit layer PCL may include one or more insulating layers.

In one or more embodiments, the display element layer DPL may be provided on the pixel circuit layer PCL. The light emitting unit (for example, a light emitting unit EMU of FIG. 5) including the light emitting element LD that emits (e.g., is configured to emit) light may be positioned in the display element layer DPL. A more detailed description of the display element layer DPL is provided herein below with reference to FIGS. 6 to 9.

In one or more embodiments, the optical layer LCL may be selectively provided on the display element layer DPL. For example, the optical layer LCL may convert the light emitted from the light emitting element LD into light having excellent or suitable color reproducibility and emit the light, thereby improving light output efficiency of each pixel PXL.

In one or more embodiments, the pixels PXL may be arranged along a row extending in the first direction DR1 and a column extending in the second direction DR2 crossing the first direction DR1. An arrangement form of the pixel PXL is not limited thereto, and the pixel PXL may be arranged in one or more suitable forms. In the drawing, the pixel PXL has a rectangular shape. However, embodiments of the present disclosure are not limited thereto, and when a plurality of pixels PXL are provided, the pixels PXL may be provided to have different areas (and/or sizes). For example, when respective colors of light emitted by the pixels PXL are different, the pixels PXL may be provided in different areas (and/or sizes) and/or in different shapes for each color.

In one or more embodiments, the light emitting element (for example, the light emitting element LD of FIG. 1) may be driven by a scan signal and a data signal corresponding to each pixel PXL. The light emitting element LD may have a size of a nano scale (or a nanometer) or a micro scale (or a micrometer). The light emitting element LD may be connected in parallel to light emitting elements LD provided adjacent to each other, but is not limited thereto. The light emitting element LD may be a light source of each pixel PXL.

In one or more embodiments, each pixel PXL may include at least one light emitting element LD driven by a signal (for example, the scan signal and the data signal) and/or power (for example, first driving power and second driving power).

In one or more embodiments, the substrate SUB may include a transparent insulating material and may transmit light. The substrate SUB may include a rigid substrate or a flexible substrate.

In one or more embodiments, the substrate SUB may include a display area DA and a non-display area NDA. For example, the substrate SUB may include the display area DA including a pixel area PXA in which each pixel PXL is provided, and the non-display area NDA provided around the display area DA (or adjacent to the display area DA). The display area DA is an area in which the pixel PXL is provided to display an image, and the non-display area NDA is an area in which the pixel PXL is not provided and may be an area in which an image is not displayed.

In one or more embodiments, the non-display area NDA may be provided on at least one side of the display area DA. For example, the non-display area NDA may surround a circumference (or an edge) of the display area DA. A portion of a line unit connected to the pixel PXL and a driver connected to the line unit and driving the pixel PXL may be provided in the non-display area NDA. The non-display area NDA may be an area in which set or predetermined lines (for example, fan-out lines LP, pads PD, and/or a built-in circuit unit) electrically connected to the pixel PXL to drive the pixel PXL are provided.

In one or more embodiments, the non-display area NDA may include a fan-out area FTA and a pad area PDA. For example, the pad area PDA may be an area of the non-display area NDA in which a pad portion PDP is positioned, and may be positioned adjacent to an edge (or a border) of the non-display area NDA. The fan-out area FTA may be another area of the non-display area NDA in which the fan-out lines LP, which are portions of the line unit, are positioned and may be positioned adjacent to the display area DA in the non-display area NDA. For example, the fan-out area FTA may include an area of the non-display area NDA positioned between the pad area PDA and the display area DA.

In one or more embodiments, the non-display area NDA may include an antistatic circuit area in which an antistatic circuit for preventing or reducing generation of static electricity by being electrically connected to signal lines positioned in the display area DA is provided. The antistatic circuit area may be an area of the non-display area NDA between the display area DA and the fan-out area FTA.

In one or more embodiments, the non-display area NDA may include an area in which a data distribution circuit (demultiplexer) is positioned.

In one or more embodiments, the pad portion PDP may be positioned in the pad area PDA, and the fan-out lines LP, which are portions of the line unit, may be positioned in the fan-out area FTA.

In one or more embodiments, the fan-out lines LP may be electrically connected to the pixel PXL to transmit a set or predetermined signal applied from the driver to the pixel PXL. The fan-out lines LP may be positioned in the fan-out area FTA and may be connection means for electrically connecting the driver and the pixel PXL.

In one or more embodiments, the pad portion PDP may include a plurality of pads PD. The pads PD may supply (or transmit) driving power and signals for driving the pixel PXL and/or the built-in circuit unit provided in the display area DA. In one or more embodiments, when the driver is mounted on the non-display area NDA of the substrate SUB, the pad portion PDP may overlap output pads of the driver to receive signals output from the driver.

Figure 5:
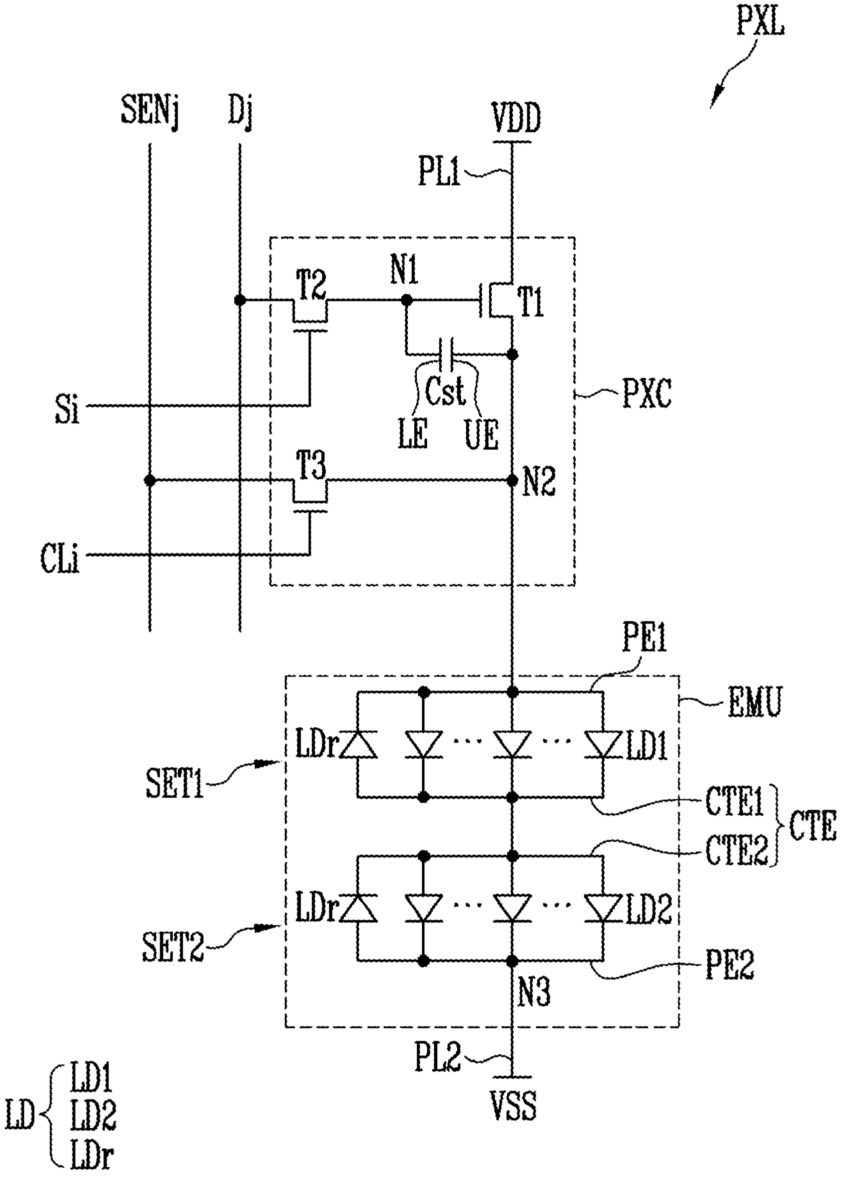
FIG. 5 is a schematic circuit diagram illustrating a pixel shown in FIG. 3 according to one or more embodiments.

FIG. 5 is a schematic circuit diagram illustrating the pixel PXL shown in FIG. 3 according to one or more embodiments.

FIG. 5 shows an electrical connection relationship between components included in the pixel PXL that may be applied to an active matrix display device according to one or more embodiments, but a connection relationship between the components of each pixel PXL is not limited thereto.

Referring to FIGS. 1 to 5, the pixel PXL may include a light emitting unit EMU (or a light emitting unit) that generates light of a luminance corresponding to the data signal. In some embodiments, the pixel PXL may selectively further include the pixel circuit PXC for driving the light emitting unit EMU.

In one or more embodiments, the light emitting unit EMU may include a plurality of light emitting elements LD connected in parallel between a first power line PL1 connected to first driving power VDD to which a voltage of the first driving power VDD is applied and a second power line PL2 connected to second driving power VSS to which a voltage of second driving power VSS is applied. For example, the light emitting unit EMU may include a first pixel electrode PE1 connected to the first driving power VDD via the pixel circuit PXC and the first power line PL1, a second pixel electrode PE2 connected to the second driving power VSS via the second power line PL2 and a third node N3, and the plurality of light emitting elements LD connected in parallel in the same direction between the first pixel electrode PE1 and the second pixel electrode PE2.

Figure 6:
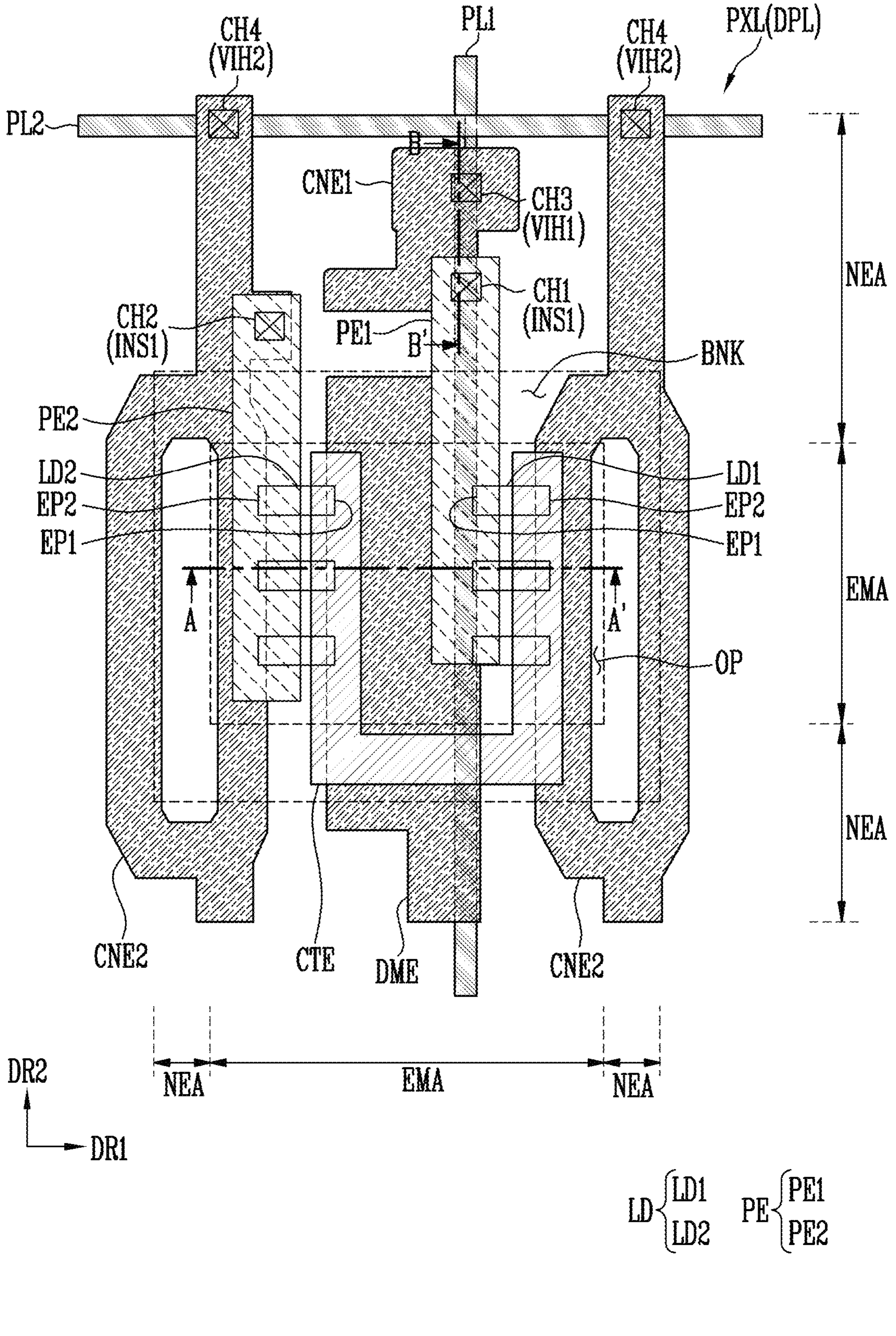
FIG. 6 is a plan view schematically illustrating a display element layer of the pixel shown in FIG. 3 according to one or more embodiments.

In one or more embodiments, the first pixel electrode PE1 may be connected to the first driving power VDD through at least one connection member (for example, a first connection electrode CNE1 of FIG. 6). For example, the second pixel electrode PE2 may be connected to the second driving power VSS through at least one connection member (for example, a second connection electrode CNE2 of FIG. 6).

In one or more embodiments, the light emitting element LD may include a first end connected to the first driving power VDD (or a second node N2) through the first pixel electrode PE1, and a second end connected to the second driving power VSS (or the third node N3) through the second pixel electrode PE2. The first driving power VDD and the second driving power VSS may have different potentials. For example, the first driving power VDD may be set as high potential power, and the second driving power VSS may be set as low potential power. A potential difference between the first driving power VDD and the second driving power VSS may be set to be equal to or greater than a threshold voltage of the light emitting element LD during an emission period of each pixel PXL.

In one or more embodiments, each light emitting element LD connected in parallel in the same direction between the first pixel electrode PE1 and the second pixel electrode PE2 to which voltages of different power are supplied may configure each effective (e.g., light-emitting) light source.

In one or more embodiments, the light emitting element LD of the light emitting unit EMU may emit light with a luminance corresponding to a driving current supplied through the pixel circuit PXC. For example, a driving current corresponding to a grayscale value of corresponding frame data of the pixel circuit PXC may be supplied to the light emitting unit EMU during each frame period. The driving current supplied to the light emitting unit EMU may be divided and may flow through each light emitting element LD. Each light emitting element LD may emit light with a luminance corresponding to the current, and the light emitting unit EMU may emit light with a luminance corresponding to the driving current.

In one or more embodiments, although the embodiment in which the both ends of the light emitting element LD are connected in the same direction between the first driving power VDD and the second driving power VSS is described, the disclosure is not limited thereto. For example, the light emitting unit EMU may further include at least one ineffective (e.g., non-light-emitting) light source, in addition to the light emitting element LD configuring each effective light source. The light emitting unit EMU may further include a reverse light emitting element LDr which may be an ineffective light source. The reverse light emitting element LDr may be connected in parallel between the first pixel electrode PE1 and the second pixel electrode PE2 together with the light emitting element LD configuring the effective light sources. The reverse light emitting element LDr may be connected between the first pixel electrode PE1 and the second pixel electrode PE2 in a direction opposite to the light emitting element LD. Even though a set or predetermined driving voltage (for example, a forward driving voltage) is applied between the first pixel electrode PE1 and the second pixel electrode PE2, a current does not flow through the reverse light emitting element LDr. For example, the reverse light emitting element LDr may maintain an inactive state even though the set or predetermined driving voltage (for example, the forward driving voltage) is applied between the first pixel electrode PE1 and the second pixel electrode PE2.

In one or more embodiments, the pixel circuit PXC may be connected to a scan line Si and a data line Dj of the pixel PXL. The pixel circuit PXC may be connected to a control line CLi and a sensing line SENj of the pixel PXL.

In one or more embodiments, the pixel circuit PXC may include first to third transistors T1, T2, and T3 and a storage capacitor Cst.

In one or more embodiments, the first transistor T1 may be a driving transistor for controlling the driving current applied to the light emitting unit EMU, and may be connected between the first driving power VDD and the light emitting unit EMU. For example, a first terminal of the first transistor T1 may be electrically connected to the first driving power VDD through the first power line PL1, a second terminal of the first transistor T1 may be connected to a second node N2, and a gate electrode of the first transistor T1 may be electrically connected to the first node N1. The first transistor T1 may control an amount of the driving current applied from the first driving power VDD to the light emitting unit EMU through the second node N2 according to a voltage applied to the first node N1. For example, the first terminal of the first transistor T1 may be a drain electrode, and the second terminal of the first transistor T1 may be a source electrode, but the disclosure is not limited thereto. For example, the first terminal of the first transistor T1 may be a source electrode, and a second terminal of the first transistor T1 may be a drain electrode.

In one or more embodiments, the second transistor T2 may be a switching transistor that selects the pixel PXL in response to a scan signal and activates the pixel PXL, and may be connected between the data line Dj and the first node N1. A first terminal of the second transistor T2 may be connected to the data line Dj, a second terminal of the second transistor T2 may be connected to the first node N1, and a gate electrode of the second transistor T2 may be connected to the scan line Si. The first terminal of the second transistor T2 may be a drain electrode, and a second terminal of the second transistor T2 may be a source electrode.

In one or more embodiments, the second transistor T2 may be turned on when a scan signal of a gate-on voltage (for example, a high level voltage) is supplied from the scan line Si to electrically connect the data line Dj and the first node N1. The first node N1 is a point where the second terminal of the second transistor T2 and the gate electrode of the first transistor T1 are connected. The second transistor T2 may transmit a data signal to the gate electrode of the first transistor T1.

In one or more embodiments, the third transistor T3 may obtain a sensing signal through the sensing line SENj by connecting the first transistor T1 to the sensing line SENj, and detect a characteristic including a threshold voltage of the first transistor T1, by using the sensing signal. Information on the characteristic of the pixel PXL may be used to convert image data so that a characteristic deviation between the pixels PXL may be compensated or reduced. A second terminal of the third transistor T3 may be connected to the second terminal of the first transistor T1, a first terminal of the third transistor T3 may be connected to the sensing line SENj, and a gate electrode of the third transistor T3 may be connected to the control line CLi. The first terminal of the third transistor T3 may be connected to initialization power. The third transistor T3 may be an initialization transistor capable of initializing the second node N2, and may be turned on when a sensing control signal is supplied from the control line CLi to transmit a voltage of the initialization power to the second node N2. A second storage electrode UE of the storage capacitor Cst electrically connected to the second node N2 may be initialized.

In one or more embodiments, the storage capacitor Cst may include a first storage electrode LE and the second storage electrode UE. The first storage electrode LE may be electrically connected to the first node N1, and the second storage electrode UE may be electrically connected to the second node N2. The storage capacitor Cst charges a data voltage corresponding to the data signal supplied to the first node N1 during one frame period. The storage capacitor Cst may store a voltage corresponding to a difference between a voltage of the gate electrode of the first transistor T1 and the voltage of the second node N2.

In one or more embodiments, the light emitting unit EMU may be configured to include at least one series stage (or stage) including the light emitting elements LD electrically connected to each other in parallel. For example, the light emitting unit EMU may be configured in a series/parallel mixed structure. For example, the light emitting unit EMU may be configured to include a first series stage SET1 and a second series stage SET2.

In one or more embodiments, the light emitting unit EMU may include the first series stage SET1 and the second series stage SET2 sequentially connected between the first driving power VDD and the second driving power VSS. Each of the first series stage SET1 and the second series stage SET2 may include two electrodes PE1 and CTE1, and CTE2 and PE2, respectively, configuring an electrode pair of a corresponding series stage, and a plurality of light emitting elements LD connected in parallel in the same direction between the two electrodes PE1 and CTE1, and CTE2 and PE2.

In one or more embodiments, the first series stage SET1 (or a first stage) may include the first pixel electrode PE1 and the first intermediate electrode CTE1, and one or more first light emitting elements LD1 connected between the first pixel electrode PE1 and the first intermediate electrode CTE1. For example, the first series stage SET1 may include a reverse light emitting element LDr connected in a direction opposite to the first light emitting elements LD1 between the first pixel electrode PE1 and the first intermediate electrode CTE1.

In one or more embodiments, the second series stage SET2 (or a second stage) may include the second intermediate electrode CTE2 and the second pixel electrode PE2, and one or more second light emitting elements LD2 connected between the second intermediate electrode CTE2 and the second pixel electrode PE2. For example, the second series stage SET2 may include a reverse light emitting element LDr connected in a direction opposite to the second light emitting elements LD2 between the second intermediate electrode CTE2 and the second pixel electrode PE2.

In one or more embodiments, the first intermediate electrode CTE1 and the second intermediate electrode CTE2 may be electrically and/or physically connected to each other. The first intermediate electrode CTE1 and the second intermediate electrode CTE2 may configure an intermediate electrode CTE electrically connecting the successive first series stage SET1 and second series stage SET2.

In one or more embodiments, the first pixel electrode PE1 of the first series stage SET1 may be an anode electrode of each pixel PXL, and the second pixel electrode PE2 of the second series stage SET2 may be a cathode electrode of each pixel PXL. For example, the first pixel electrode PE1 may be electrically connected to the pixel circuit PXC through the second node N2. The second pixel electrode PE2 may be electrically connected to the second power line PL2 through the third node N3. The second node N2 may be a first point at which the pixel circuit PXC and the light emitting unit EMU are connected, and the third node N3 may be another point at which the second power line PL2 and the light emitting unit EMU are connected.

In one or more embodiments, the light emitting unit EMU of the pixel PXL including the series stages SET1 and SET2 (or the light emitting element LD) connected in a series and/or parallel mixed structure may easily or suitably control a driving current/voltage condition according to an applied product specification.

In one or more embodiments, the light emitting unit EMU may include series stages SET1 and SET2 (or the light emitting element LD) connected in a series/parallel mixed structure.

In one or more embodiments, the light emitting unit EMU of the pixel PXL may reduce a driving current compared to a light emitting unit of a structure in which the light emitting elements LD are connected only in parallel. In addition, the light emitting unit EMU of the pixel PXL may reduce the driving voltage applied to the both ends of the light emitting unit EMU compared to a light emitting unit of a structure in which all of the same number of light emitting elements LD are connected in series. The light emitting unit EMU may include a larger number of light emitting elements LD between the same electrodes PE1, CTE1, CTE2, and PE2 compared to a light emitting unit of a structure in which all series stages (or stages) (e.g., all series stages and corresponding light emitting elements LD within the stages) are connected in series. The light output efficiency of the light emitting element LD may be improved, and even though a defect may occur in a given or specific series stage (or stage), a ratio of a light emitting element LD (e.g., a number of individual light emitting elements LD) that does (do) not emit light due to the defect may be relatively reduced, and thus a reduction of the light output efficiency of the light emitting element LD may be alleviated or reduced.

FIG. 6 is a plan view schematically illustrating the display element layer DPL of the pixel PXL shown in FIG. 3 according to one or more embodiments.

In FIG. 6, transistors electrically connected to the light emitting element LD and signal lines electrically connected to the transistors are omitted (e.g., are not shown) for ease of description.

In FIG. 6, a horizontal direction on a plane is indicated as a first direction DR1 and a vertical direction on the plane is indicated as a second direction DR2 for convenience of description.

Referring to FIGS. 1 to 6, the display element layer DPL of the pixel PXL may include the light emitting element LD electrically connected to a corresponding pixel circuit PXC to emit light and electrodes (or electrode patterns) electrically connected to the light emitting element LD. For example, the light emitting unit (for example, the light emitting unit EMU of FIG. 5) of each pixel PXL may be provided in the display element layer DPL.

In one or more embodiments, the pixel PXL may include an emission area EMA and a non-emission area NEA surrounding (e.g., around) the emission area EMA.

In one or more embodiments, the display element layer DPL may include a bank BNK positioned in the non-emission area NEA. For example, the bank BNK may be a structure defining (or partitioning) the emission area EMA of each adjacent pixel PXL, and may be a pixel defining layer. The bank BNK may be a pixel defining layer and/or a dam structure that defines a supply position of the light emitting element LD in a process of supplying (or inputting) the light emitting element LD to each pixel PXL. As the emission area EMA of each pixel PXL is partitioned by the bank BNK, a desired amount of a mixed solution (for example, ink) including the light emitting element LD may be supplied to the emission area EMA.

In one or more embodiments, the bank BNK may include at least one opening OP exposing some configurations of the display element layer DPL. In one or more embodiments, the emission area EMA of each pixel PXL and the opening OP of the bank BNK may correspond to each other.

In one or more embodiments, the bank BNK may be configured to include at least one light blocking material and/or reflective material (or scattering material) to prevent or reduce light leakage in which light (or rays) is leaked between adjacent pixels PXL. For example, the bank BNK may include a transparent material. The transparent material may include a polyamide resin and/or a polyimide resin, but is not limited to thereto. In some embodiments, a reflective material layer may be separately provided on the bank BNK to further improve efficiency of light emitted from each pixel PXL.

In one or more embodiments, the display element layer DPL may include a pixel electrode PE provided in the emission area EMA, the intermediate electrode CTE, the light emitting element LD electrically connected to the pixel electrode PE and the intermediate electrode CTE, and the first and second connection electrodes CNE1 and CNE2 electrically connected to the pixel electrode PE.

In one or more embodiments, the first and second connection electrodes CNE1 and CNE2, the light emitting element LD, and the first and second pixel electrodes PE1 and PE2 may be sequentially provided based on one surface of the substrate SUB on which each pixel PXL is provided, but the disclosure is not limited thereto. For example, a position order and/or a shape of the electrode patterns included in the display element layer DPL may be suitably changed according to one or more embodiments.

In one or more embodiments, the first and second connection electrodes CNE1 and CNE2 electrically connected to the pixel electrode PE may be provided on a substrate (for example, the substrate SUB of FIG. 4).

In one or more embodiments, the first connection electrode CNE1 may be provided on the substrate SUB and may be physically and/or electrically connected to the first power line PL1 of the pixel circuit layer (for example, the pixel circuit PXC of FIG. 4) through a third contact hole CH3 and a first via hole VIH1. For example, the first connection electrode CNE1 may be connected to (e.g., receive) the first driving power VDD through the first power line PL1. The third contact hole CH3 and the first via hole VIH1 may be formed in a via layer (for example, a via layer VIA of FIG. 8) between the first connection electrode CNE1 and the first power line PL1.

In one or more embodiments, the first connection electrode CNE1 may be connected to the first pixel electrode PE1 through a first contact hole CH1 formed in a first insulating layer INS1. The first pixel electrode PE1 may receive the first driving power VDD through the first connection electrode CNE1.

In one or more embodiments, the second connection electrode CNE2 may be provided to be spaced apart from the first connection electrode CNE1 on the substrate SUB in the first direction DR1, and may be physically and/or electrically connected to the second power line PL2 of the pixel circuit PXC through a fourth contact hole CH4 and a second via hole VIH2. The second connection electrode CNE2 may be connected to the second driving power VSS through the second power line PL2. The fourth contact hole CH4 and the second via hole VIH2 may be formed in the via layer VIA between the second connection electrode CNE2 and the second power line PL2.

In one or more embodiments, the second connection electrode CNE2 may be connected to the second pixel electrode PE2 through the second contact hole CH2 formed in the first insulating layer INS1. The second pixel electrode PE2 may receive the second driving power VSS through the second connection electrode CNE2.

In one or more embodiments, the display element layer DPL may include a dummy electrode DME provided in the emission area EMA. For example, the dummy electrode DME may be provided to be spaced apart from the first connection electrode CNE1 in the second direction DR2. For example, the dummy electrode DME and the first connection electrode CNE1 may be each electrode formed separately from one electrode (for example, an alignment electrode ALE1 of FIG. 7A).

In one or more embodiments, the second connection electrode CNE2 may be provided to be spaced apart from the first connection electrode CNE1 and the dummy electrode DME along the first direction DR1. For example, the second connection electrode CNE2 may be provided to be spaced apart on a left side and a right side along the first direction DR1 of the first connection electrode CNE1 and the dummy electrode DME. A plurality of second connection electrodes CNE2 provided on the left side and the right side in the first direction DR1 of the first connection electrode CNE1 and the dummy electrode DME may be respectively integrally formed.

In one or more embodiments, the first connection electrode CNE1, the second connection electrode CNE2, and the dummy electrode DME may have a bent portion in the non-emission area NEA, but the disclosure is not limited thereto, and the first connection electrode CNE1, the second connection electrode CNE2, and the dummy electrode DME may include an electrode having a bar shape having a substantially constant width.

In one or more embodiments, the first connection electrode CNE1, the second connection electrode CNE2, and the dummy electrode DME may be provided on the same layer. For example, the first connection electrode CNE1, the second connection electrode CNE2, and the dummy electrode DME may be provided on the same insulating layer and may include the same material.

In one or more embodiments, the first connection electrode CNE1 may be provided in the non-emission area NEA. For example, the first connection electrode CNE1 may not overlap the light emitting element LD. For example, in a plan view, the light emitting element LD is not provided on the first connection electrode CNE1.

In one or more embodiments, in a plan view, the light emitting element LD may be provided between the second connection electrode CNE2 and the dummy electrode DME. For example, the light emitting element LD may include first light emitting elements LD1 and second light emitting elements LD2. The first light emitting elements LD1 may be arranged between the second connection electrode CNE2 and one side of the dummy electrode DME. The first light emitting elements LD1 may be connected in parallel to each other. The second light emitting elements LD2 may be arranged between another second connection electrode CNE2 and another side of the dummy electrode DME. For example, the other side of the dummy electrode DME may be opposite to the one side of the dummy electrode DME. The second light emitting elements LD2 may be connected in parallel to each other.

According to such a disposition relationship of the light emitting element LD, the first light emitting elements LD1 and the second light emitting elements LD2 may be electrically connected to each other.

In one or more embodiments, each light emitting element LD may include the first end EP1 and the second end EP2 positioned at both ends of the respective light emitting element LD in the length direction thereof (for example, the first direction DR1). For example, the second semiconductor layer (for example, the second semiconductor layer 13 of FIG. 1) including the p-type semiconductor layer may be positioned at the first end EP1 of the light emitting element LD. The first semiconductor layer (for example, the first semiconductor layer 11 of FIG. 1) including the n-type semiconductor layer may be positioned at the second end EP2.

In one or more embodiments, each light emitting element LD may emit at least one of color light and white light. For example, the light emitting element LD may emit blue light.

In one or more embodiments, the pixel electrode PE provided in the emission area EMA may include the first pixel electrode PE1 and the second pixel electrode PE2. The first pixel electrode PE1 and the second pixel electrode PE2 may be driving electrodes driving (e.g., configured to drive) the light emitting element LD. In one or more embodiments, the first pixel electrode PE1 and the second pixel electrode PE2 may be provided on the first connection electrode CNE1, the second connection electrode CNE2, and the dummy electrode DME.

In one or more embodiments, the first pixel electrode PE1 may be electrically connected to the first connection electrode CNE1 through the first contact hole CH1. The second pixel electrode PE2 may be electrically connected to the second connection electrode CNE2 through the second contact hole CH2. For example, the first insulating layer INS1 may be provided between the first and second pixel electrodes PE1 and PE2 and the first and second connection electrodes CNE1 and CNE2. The first contact hole CH1 and the second contact hole CH2 may be formed by removing a portion of the first insulating layer INS1.

In one or more embodiments, the intermediate electrode CTE may be provided to be spaced apart from the first pixel electrode PE1 and the second pixel electrode PE2 in the emission area EMA. For example, the intermediate electrode CTE may have a shape that is bent at least once to surround at least one side (e.g., one end) of the first pixel electrode PE1.

In one or more embodiments, the first light emitting elements LD1 may be provided between the dummy electrode DME and the second connection electrode CNE2 to be electrically connected to the first pixel electrode PE1 and the intermediate electrode CTE. The second light emitting elements LD2 may be provided between the dummy electrode DME and another second connection electrode CNE2 to be electrically connected to the intermediate electrode CTE and the second pixel electrode PE2.

In one or more embodiments, the first and second pixel electrodes PE1 and PE2 may not be electrically connected to the dummy electrode DME. For example, the dummy electrode DME may have an island shape which is not connected to other conductive layers (or conductive patterns) (for example, in a floating state).

For example, the first pixel electrode PE1 and the intermediate electrode CTE may be formed on the dummy electrode DME, but the dummy electrode DME is not electrically connected the first pixel electrode PE1 and the intermediate electrode CTE. Therefore, a potential difference may not be formed between the first pixel electrode PE1 and the dummy electrode DME and between the intermediate electrode CTE and the dummy electrode DME, and acceleration of a galvanic phenomenon of the first pixel electrode PE1 and the intermediate electrode CTE according to the potential difference between the first pixel electrode PE1 and the dummy electrode DME and between the intermediate electrode CTE and the dummy electrode DME may be prevented or reduced.

In one or more embodiments, the first end EP1 of the first light emitting elements LD1 may be electrically connected to the first pixel electrode PE1, and the second end EP2 of the first light emitting elements LD1 may be electrically connected to the intermediate electrode CTE. For example, the first light emitting elements LD1 may be connected in parallel between the first pixel electrode PE1 and the intermediate electrode CTE.

In one or more embodiments, the first end EP1 of the second light emitting elements LD2 may be electrically connected to the intermediate electrode CTE, and the second end EP2 of the second light emitting elements LD2 may be electrically connected to the second pixel electrode PE2. The second light emitting elements LD2 may be connected in parallel between the intermediate electrode CTE and the second pixel electrode PE2.

In one or more embodiments, the first and second pixel electrodes PE1 and PE2 and the intermediate electrode CTE may be provided in the emission area EMA and the non-emission area NEA of the pixel PXL, and each of the first and second pixel electrodes PE1 and PE2 and the intermediate electrode CTE may be provided in a position corresponding to one or more of the first and second connection electrodes CNE1 and CNE2, the dummy electrode DME, and the light emitting element LD. For example, the first pixel electrode PE1 and the intermediate electrode CTE may be formed on the first light emitting elements LD1 to be electrically connected to the first light emitting elements LD1. The second pixel electrode PE2 and the intermediate electrode CTE may be formed on the second light emitting elements LD2 to be electrically connected to the second light emitting elements LD2.

In one or more embodiments, the first pixel electrode PE1 and the second pixel electrode PE2 may have a bar type shape (e.g., bar shape) having a substantially constant width along the second direction DR2.

In one or more embodiments, the first light emitting elements LD1 may be connected in series to the second light emitting elements LD2 through the intermediate electrode CTE. The first pixel electrode PE1 and the intermediate electrode CTE may configure the first series stage (for example, the first series stage SET1) of the light emitting unit (for example, the light emitting unit EMU of FIG. 5) of the display element layer DPL together with the first light emitting elements LD1 connected in parallel between the first pixel electrode PE1 and the intermediate electrode CTE. The intermediate electrode CTE and the second pixel electrode PE2 may configure the second series stage (for example, the second series stage SET2 of FIG. 5) of the light emitting unit EMU together with the second light emitting elements LD2 connected between the intermediate electrode CTE and the second pixel electrode PE2. The first pixel electrode PE1 is an anode electrode of the light emitting unit EMU, and the second pixel electrode PE2 may be a cathode electrode.

In one or more embodiments, the first pixel electrode PE1 may be connected to (e.g., to receive) the first driving power VDD through the first power line PL1 connected to the first connection electrode CNE1, and thus the driving current may flow to the second pixel electrode PE2 through the first light emitting elements LD1, the intermediate electrode CTE, and the second light emitting elements LD2 during each frame period. The second pixel electrode PE2 may be connected to the second driving power VSS through the second power line PL2 connected to the second connection electrode CNE2.

In one or more embodiments, the first power line PL1 may be provided to extend in the second direction DR2, and the second power line PL2 may be provided to extend in the first direction DR1, but the disclosure is not limited thereto. For example, the first power line PL1 may be provided to extend in the first direction DR1, and the second power line PL2 may be provided to extend in the second direction DR2.

In one or more embodiments, a layer in which the first power line PL1 is provided may be in a layer different from a layer in which the second power line PL2 is provided.

In one or more embodiments, the dummy electrode DME may be provided to be spaced apart from the first connection electrode CNE1 and may not physically and electrically contact the first connection electrode CNE1.

As described above, the dummy electrode DME may not electrically and physically contact the first pixel electrode PE1 and the intermediate electrode CTE. A galvanic reaction that may occur due to particle intrusion into the intermediate electrode CTE and the first pixel electrode PE1, and occurrence of a short circuit and a progressive dark spot according to the galvanic reaction may be prevented or reduced by the dummy electrode DME provided in the emission area EMA.

Figure 7A:
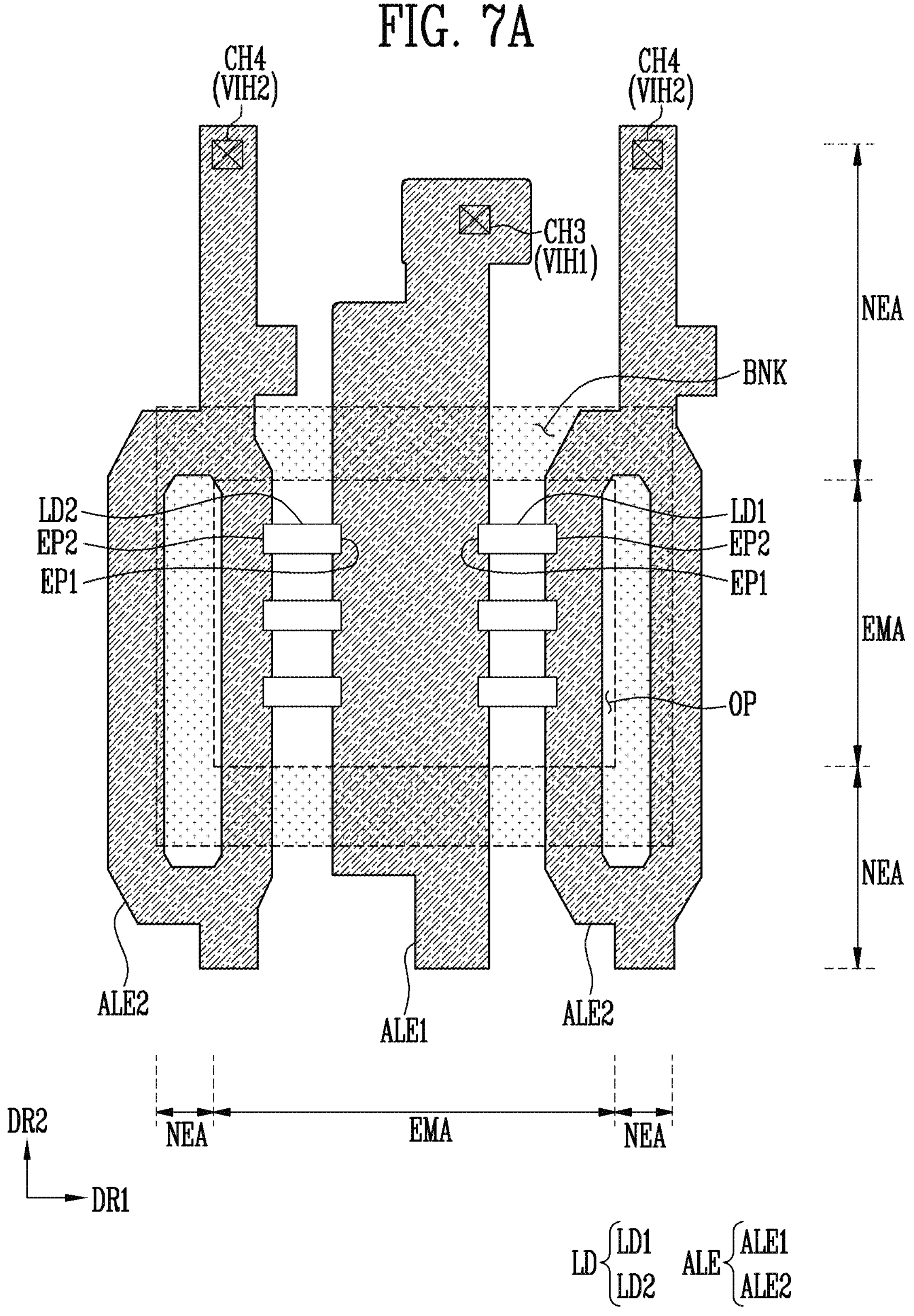
FIGS. 7A and 7B are plan views illustrating a method of manufacturing a display device according to one or more embodiments.
Figure 7B:
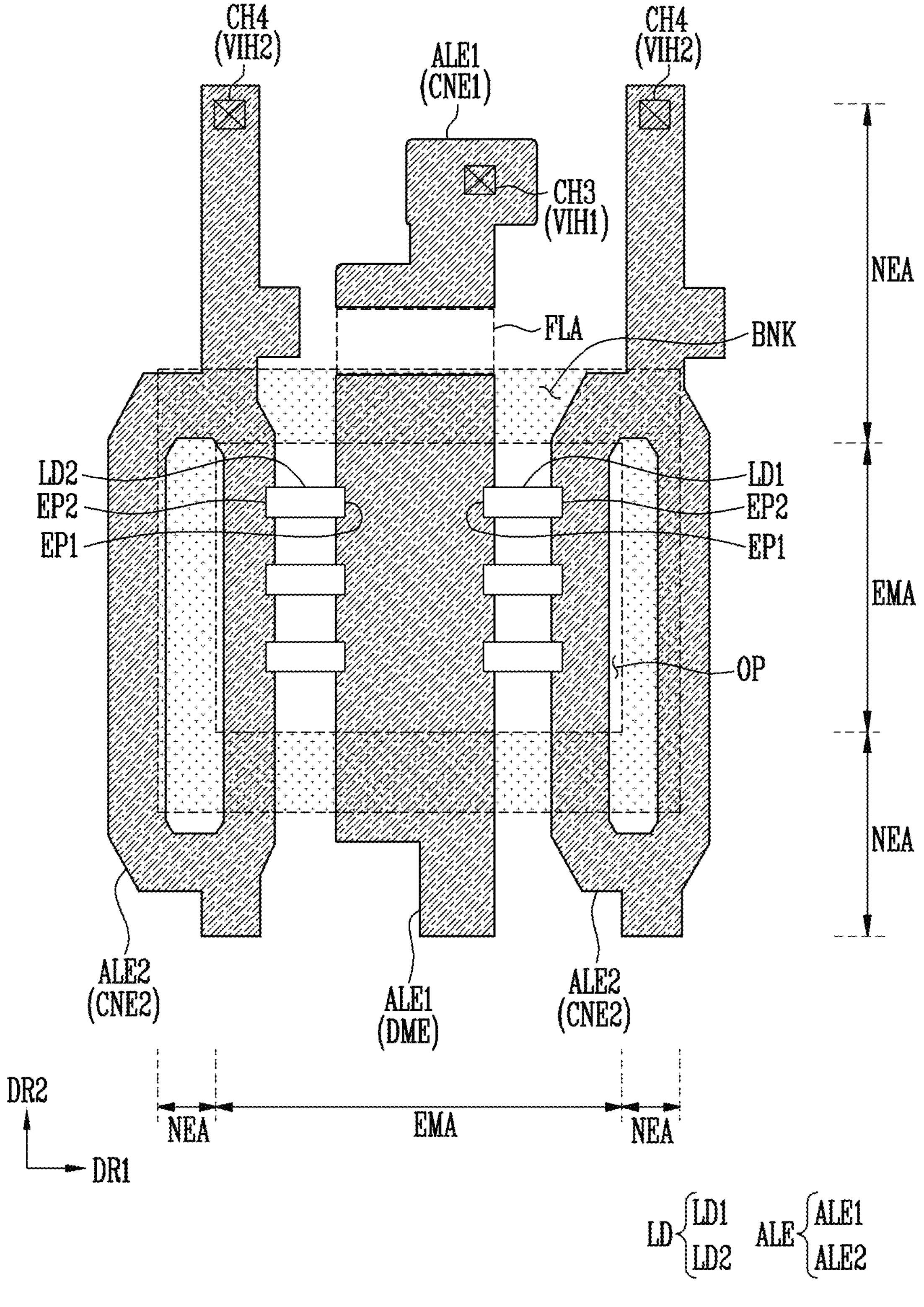

FIGS. 7A and 7B are plan views illustrating a method of manufacturing a display device according to one or more embodiments.

Referring to FIGS. 6, 7A, and 7B, the method of manufacturing the display device may include forming the first alignment electrode ALE1 and a second alignment electrode ALE2 on the substrate, forming the first insulating layer on the first alignment electrode ALE1 and the second alignment electrode ALE2, positioning and aligning the light emitting element LD on the first alignment electrode ALE1 and the second alignment electrode ALE2, separating the first alignment electrode ALE1 into the first connection electrode CNE1 and the dummy electrode DME by removing a portion of the first alignment electrode ALE1, and forming the first pixel electrode PE1 and the second pixel electrode PE2 on the light emitting element LD to be spaced apart from each other.

FIG. 7A illustrates the first alignment electrode ALE1, the second alignment electrode ALE2, and the light emitting element LD according to one or more embodiments.

In one or more embodiments, the alignment electrode ALE and a plurality of light emitting elements LD may be provided in the emission area EMA.

In one or more embodiments, the alignment electrode ALE may be formed on the substrate (for example, the substrate SUB of FIG. 4). The alignment electrode ALE may include the first alignment electrode ALE1 and the second alignment electrode ALE2. For example, the first alignment electrode ALE1 and the second alignment electrode ALE2 may be provided to be spaced apart from the respective alignment electrode ALE adjacent thereto along the first direction DR1. For example, in the emission area EMA, the second alignment electrode ALE2 may be provided to be spaced apart from a left side of the first alignment electrode ALE1 in the first direction DR1, and another second alignment electrode ALE2 may be provided to be spaced apart from a right side of the first alignment electrode ALE1 in the first direction DR1. A distance between the first alignment electrode ALE1 and the second alignment electrode ALE2 and a distance between the first alignment electrode ALE1 and the other second alignment electrode ALE2 may be the same, but the disclosure is not limited thereto.

In one or more embodiments, an insulating layer (for example, the first insulating layer INS1 of FIG. 8) may be provided on the first alignment electrode ALE1 and the second alignment electrode ALE2. For example, the first insulating layer INS1 may cover the first alignment electrode ALE1 and the second alignment electrode ALE2.

In one or more embodiments, each of the first alignment electrode ALE1 and the second alignment electrode ALE2 may be utilized as an alignment line for aligning the light emitting element LD by receiving a set or predetermined signal (for example, an alignment signal) before the light emitting element LD is aligned in the emission area EMA of each pixel PXL.

In one or more embodiments, the bank BNK may be formed after a process of forming the first alignment electrode ALE1 and the second alignment electrode ALE2 is completed.

In one or more embodiments, the bank BNK may be formed on the first insulating layer INS1 in the non-emission area NEA. The bank BNK may surround the emission area EMA of the pixel PXL and may be formed between adjacent pixels PXL to configure a pixel defining layer that partitions the emission area EMA of the corresponding pixel PXL.

In one or more embodiments, the bank BNK may form a dam structure that prevents or reduces the flow of a solution (or ink) mixed with the light emitting element LD into the emission area EMA of the adjacent pixel PXL, and/or controls an appropriate or suitable amount of solution to be supplied to each emission area EMA in a step of supplying the light emitting element LD to the emission area EMA.

In one or more embodiments, after a process of forming the bank BNK is completed, the light emitting element LD may be provided in the emission area EMA. For example, the light emitting element LD may be input (or supplied) to the emission area EMA through an inkjet printing method, a slit coating method, or one or more other suitable methods. For example, the light emitting element LD may be mixed with a volatile solvent and input (or supplied) to the emission area EMA through an inkjet printing method or a slit coating method. An alignment signal corresponding to each of the first alignment electrode ALE1 and the second alignment electrode ALE2 may be applied. For example, an electric field may be formed between the second alignment electrode ALE2 and the first alignment electrode ALE1 and between the first alignment electrode ALE1 and the other second alignment electrode ALE2.

In one or more embodiments, the first alignment electrode ALE1 may receive a first alignment signal in an alignment step of the light emitting element LD, and the second alignment electrode ALE2 may receive a second alignment signal in the alignment step of the light emitting element LD. The first alignment signal and the second alignment signal may be signals having a voltage difference and/or a phase difference sufficient or suitable to align the plurality of light emitting elements LD between the respective alignment electrodes ALE. At least one of the first alignment signal and the second alignment signal may be an AC signal, but is not limited thereto. For example, the first alignment signal supplied to the first alignment electrode ALE1 may be an AC signal, and the second alignment signal supplied to the second alignment electrode ALE2 may be a ground voltage, but the disclosure is not limited thereto.

In one or more embodiments, as the electric field is formed between the second alignment electrode ALE2 and the first alignment electrode ALE1 and between the first alignment electrode ALE1 and the other second alignment electrode ALE2, the light emitting element LD existing between the second alignment electrode ALE2 and the first alignment electrode ALE1 and between the first alignment electrode ALE1 and the other second alignment electrode ALE2 may be aligned.

In one or more embodiments, each of the first light emitting elements LD1 existing between the second alignment electrode ALE2 and the first alignment electrode ALE1 may be aligned. Each of the second light emitting elements LD2 existing between the first alignment electrode ALE1 and the other second alignment electrode ALE2 may be aligned.

In one or more embodiments, the light emitting element LD provided between the second alignment electrode ALE2 and the first alignment electrode ALE1 and between the first alignment electrode ALE1 and the other second alignment electrode ALE2 may be stably or suitably aligned by volatilizing the solvent and/or removing the solvent by other methods after the light emitting element LD is aligned.

In one or more embodiments, the first alignment electrode ALE1 may be connected to the first power line PL1 of the pixel circuit layer (for example, the pixel circuit PXC of FIG. 4) through the third contact hole CH3 and the first via hole VIH1 connected to at least one area of the first alignment electrode ALE1 positioned in the non-emission area NEA.

In one or more embodiments, the first alignment electrode ALE1 may contact (e.g., may be connected to or may receive) the first driving power VDD through the third contact hole CH3 and the first via hole VIH1.

In one or more embodiments, the second alignment electrode ALE2 may be connected to the second power line PL2 of the pixel circuit PXC through the fourth contact hole CH4 and the second via hole VIH2 connected to at least one area of the second alignment electrode ALE2 positioned in the non-emission area NEA. In one or more embodiments, the second alignment electrode ALE2 may contact (e.g., may be connected to or may receive) the second driving power VSS through the fourth contact hole CH4 and the second via hole VIH2.

As shown in FIG. 7B, after the alignment process of the light emitting element LD is completed, the first alignment electrode ALE1 may be separated into the first connection electrode CNE1 and the dummy electrode DME. In one or more embodiments, a portion of the first alignment electrode ALE1 positioned in the non-emission area NEA may be removed, and the first alignment electrode ALE1 may be separated into the first connection electrode CNE1 and the dummy electrode DME.

An area corresponding to the portion from which the first alignment electrode ALE1 is removed may be referred to as a floating area FLA.

In one or more embodiments, a process of removing an area of the first alignment electrode ALE1 to separate the first alignment electrode ALE1 into the first connection electrode CNE1 and the dummy electrode DME may form a floating hole by irradiating laser light to the first alignment electrode ALE1 to remove a portion of the first alignment electrode ALE1.

In one or more embodiments, the first connection electrode CNE1 may be provided in the non-emission area NEA and may not overlap the light emitting element LD. For example, the dummy electrode DME may be provided in the emission area EMA and may overlap the light emitting element LD. For example, a cross-sectional area of the dummy electrode DME in a direction substantially perpendicular to an emission direction of the light emitting element LD may be greater than a cross-sectional area of the first connection electrode CNE1. For example, because the cross-sectional area of the dummy electrode DME is greater than the cross-sectional area of the first connection electrode CNE1, an area of a conductor electrically connected to the first pixel electrode PE1 and the intermediate electrode CTE provided after the process of removing one area of the first alignment electrode ALE1 is completed may be minimized or reduced. Therefore, a galvanic reaction according to an input of moisture and/or an impurity (a particle) input through a void formed in a seam of a connection member (for example, the first insulating layer INS1 of FIG. 8) connected to the dummy electrode DME may be minimized or reduced.

In addition, such a problem may be solved by separating the first alignment electrode ALE1 into the first connection electrode CNE1 and the dummy electrode DME through a process (for example, a reflected metal open (RMO) process) of a manufacturing process of the pixel. For example, because the above-described problem is solved by adding a minimum process (e.g., by not substantially increasing or adding the manufacturing process), it may be advantageous in terms of yield with respect to the manufacturing process of forming the first connection electrode CNE1 and the dummy electrode DME.

Referring to FIG. 6, the first connection electrode CNE1 may be electrically connected to the first power line PL1 through the third contact hole CH3 and the first via hole VIH1. Because the dummy electrode DME is provided to be spaced apart from the first connection electrode CNE1, the dummy electrode DME may not be electrically connected to the first connection electrode CNE1.

In one or more embodiments, the first connection electrode CNE1 may be provided to be spaced apart from the dummy electrode DME by the floating area FLA in the second direction DR2.

Figure 8:
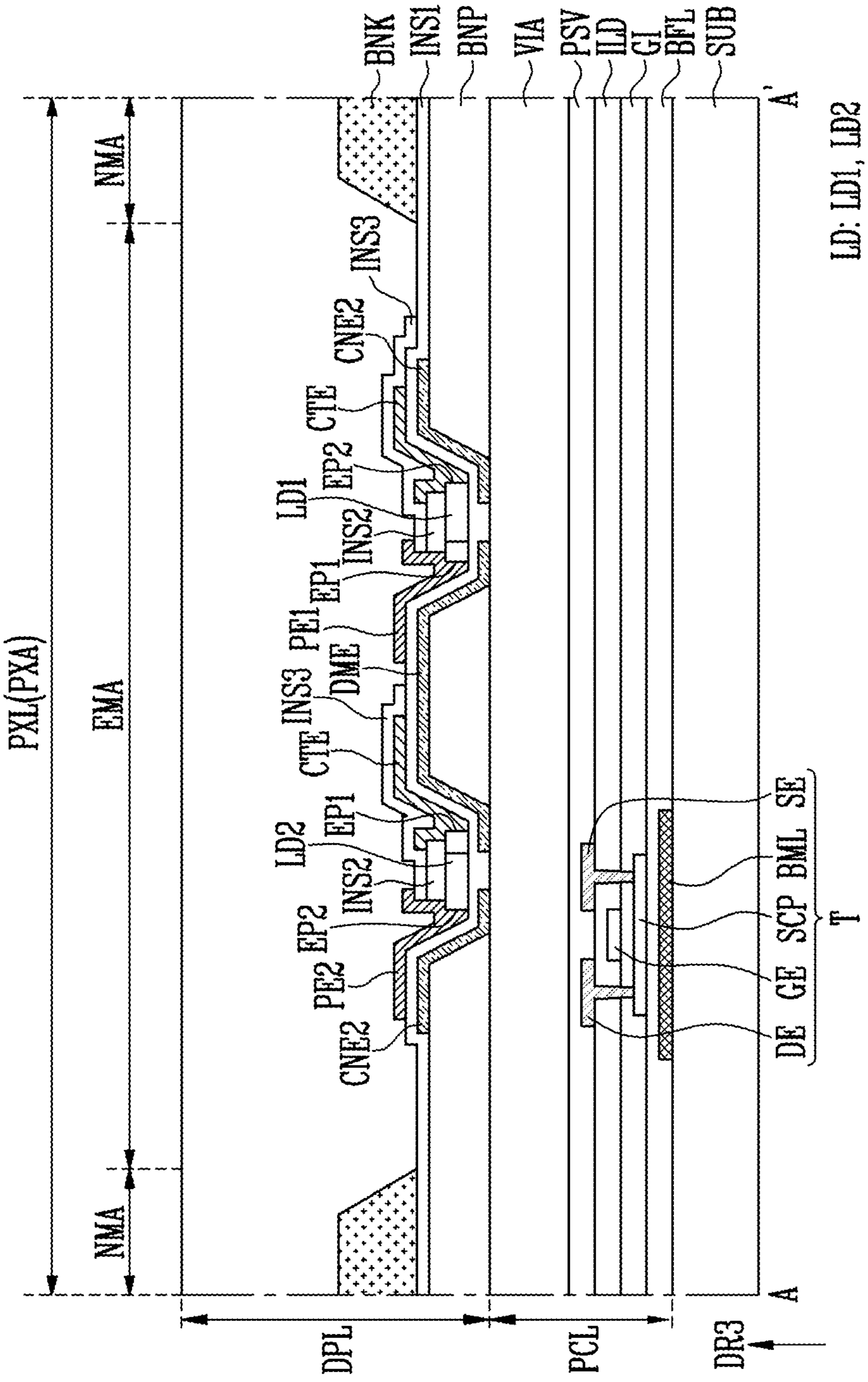
FIG. 8 illustrates a cross-sectional view taken along a line A-A' of FIG. 6 according to one or more embodiments.

As shown in FIG. 8, after a process of removing one area of the first alignment electrode ALE1 positioned in the non-emission area NEA is completed, a second insulating layer INS2 may be formed on the light emitting element LD.

After a process of forming the second insulating layer INS2 on the light emitting element LD is completed, the first pixel electrode PE1 and the second pixel electrode PE2 may be formed to be spaced apart from each other on the light emitting element LD.

In one or more embodiments, the first pixel electrode PE1 may be provided to overlap the first connection electrode CNE1 and the dummy electrode DME. For example, the first pixel electrode PE1 may overlap at least one area of the first connection electrode CNE1. For example, the first pixel electrode PE1 may be connected to the first connection electrode CNE1 through the first contact hole CH1 formed in the first insulating layer INS1 positioned between the first connection electrode CEN1 and the first pixel electrode PE1.

In one or more embodiments, the second pixel electrode PE2 may be provided to overlap the second connection electrode CNE2 corresponding to the second alignment electrode ALE2. For example, the second pixel electrode PE2 may overlap at least one area of the second connection electrode CNE2. For example, the second pixel electrode PE2 may be connected to the second connection electrode CNE2 through the second contact hole CH2 formed in the first insulating layer INS1 positioned between the second connection electrode CNE2 and the second pixel electrode PE2.

In one or more embodiments, a process of forming the first pixel electrode PE1 and the second pixel electrode PE2 may be performed substantially simultaneously (or concurrently) or sequentially. For example, after the first pixel electrode PE1 is formed, the second pixel electrode PE2 may be formed, or after the second pixel electrode PE2 is formed, the first pixel electrode PE1 may be formed.

In one or more embodiments, the intermediate electrode CTE may be provided on the dummy electrode DME. For example, the intermediate electrode CTE may overlap at least one area of the dummy electrode DME and may be formed to surround the first pixel electrode PE1. For example, the intermediate electrode CTE may be formed in a "U" shape to surround the first pixel electrode PE1.

The second connection electrode CNE2 may transmit the second driving power VSS to the second pixel electrode PE2 through the fourth contact hole CH4 and the second via hole VIH2 connected to the second power line PL2.

Hereinafter, because a description related to the first connection electrode CNE1, the second connection electrode CNE2, and the dummy electrode DME, and the first pixel electrode PE1, the second pixel electrode PE2, and the intermediate electrode CTE provided on the light emitting element LD is given with reference to FIG. 6, a repetitive description is not provided.

Hereinafter, a stack structure of the pixel PXL according to the above-described embodiment is mainly described with reference to FIGS. 8 and 9.

FIG. 8 illustrates a cross-sectional view taken along a line A-A' of FIG. 6 according to one or more embodiments.

Figure 9:
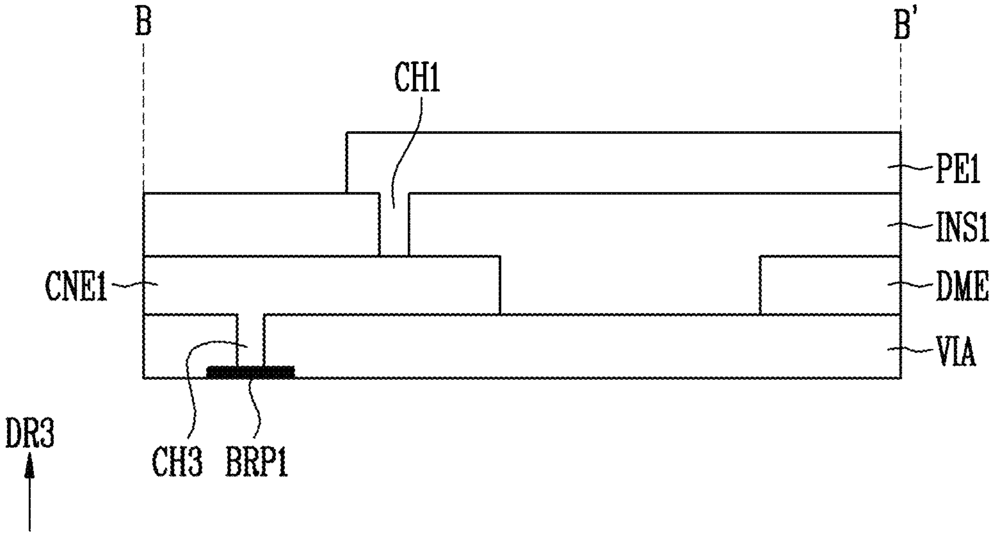
FIG. 9 illustrates a cross-sectional view taken along a line B-B' of FIG. 6 according to one or more embodiments.

In FIGS. 8 and 9, a vertical direction is shown as a third direction DR3 on a cross-section.

In order to avoid a repetitive description with respect to the embodiment of FIG. 8, features different from those of the above-described embodiment are mainly described.

Referring to FIG. 8, the pixel PXL may include the substrate SUB, the pixel circuit layer PCL, and the display element layer DPL.

In one or more embodiments, the pixel circuit layer PCL and the display element layer DPL may be provided to overlap each other on one surface of the substrate SUB. For example, the pixel area PXA of the substrate SUB may include the pixel circuit layer PCL provided on one surface of the substrate SUB and the display element layer DPL provided on the pixel circuit layer PCL. However, a mutual position of the pixel circuit layer PCL and the display element layer DPL on the substrate SUB may vary according to one or more embodiments. When the pixel circuit layer PCL and the display element layer DPL are separated as separate layers and overlapped, each layout space for forming the pixel circuit PXC and the light emitting unit EMU may be sufficiently or suitably secured on a plane. In some embodiments, the pixel circuit layer PCL and the display element layer DPL may not overlap and may be provided on the same plane.

In one or more embodiments, the pixel circuit layer PCL may include at least one insulating layer provided on the substrate SUB. For example, the pixel circuit layer PCL may include a buffer layer BFL, a gate insulating layer GI, an interlayer insulating layer ILD, a passivation layer PSV, and the via layer VIA sequentially stacked on one surface along the third direction DR3.

In one or more embodiments, the buffer layer BFL may be entirely provided on the substrate SUB. The buffer layer BFL may prevent or reduce diffusion of an impurity into transistors T (for example, the first, second, and third transistors T1, T2 and T3 of FIG. 5) included in the pixel circuit PXC. The buffer layer BFL may be an inorganic insulating layer including an inorganic material. For example, the buffer layer BFL may include at least one of inorganic materials containing a metal oxide such as silicon nitride ($SiN_x$), silicon oxide ($SiO_x$), silicon oxynitride ($SiO_xN_y$), and/or aluminum oxide ($AlO_x$). The buffer layer BFL may be provided as a single layer, but may also be provided as multiple layers of at least double layers. When the buffer layer BFL is provided in the multiple layers, each layer may be formed of the same material or different materials. The buffer layer BFL may be omitted according to a material, a process condition, and/or the like of the substrate SUB.

In one or more embodiments, the gate insulating layer GI may be entirely provided on the buffer layer BFL. The gate insulating layer GI may include the same material as the buffer layer BFL or may include one or more suitable materials selected from materials exemplified as a configuration material of the buffer layer BFL. For example, the gate insulating layer GI may be an inorganic insulating layer including an inorganic material.

In one or more embodiments, the interlayer insulating layer ILD may be entirely provided and/or formed on the gate insulating layer GI. The interlayer insulating layer ILD may include the same material as the gate insulating layer GI or may include one or more suitable materials selected from the materials exemplified as a configuration material of the gate insulating layer GI.

In one or more embodiments, the passivation layer PSV may be entirely provided and/or formed on the interlayer insulating layer ILD. The passivation layer PSV may be an inorganic insulating layer including an inorganic material or an organic insulating layer including an organic material. For example, the inorganic insulating layer may include at least one of inorganic materials containing a metal oxide such as silicon oxide ($SiO_x$), silicon nitride ($SiN_x$), silicon oxynitride ($SiO_xN_y$), and/or aluminum oxide ($AlO_x$). The organic insulating layer may include at least one of acrylic resin (polyacrylates resin), epoxy resin, phenolic resin, polyamides resin, polyimides rein, unsaturated polyester resin, polyphenylene ethers resin, polyphenylene sulfides resin, and benzocyclobutene resin.

In one or more embodiments, the passivation layer PSV may be partially opened to expose a partial configuration of the pixel circuit PXC.

In one or more embodiments, the via layer VIA may be entirely provided and/or formed on the passivation layer PSV. The via layer VIA may be configured as a single layer including an organic layer or multiple layers of double layers or more. According to one or more embodiments, the via layer VIA may be provided in a form including an inorganic layer and an organic layer provided on the inorganic layer. When the via layer VIA is provided as the multiple layers of double layers or more, an organic layer configuring the via layer VIA may be positioned on an uppermost layer. The via layer VIA may include at least one of acrylic resin (polyacrylates resin), epoxy resin, phenolic resin, polyamides resin, polyimides rein, unsaturated polyester resin, polyphenylene ethers resin, polyphenylene sulfides resin, and benzocyclobutene resin.

In one or more embodiments, the via layer VIA may be utilized as a planarization layer for alleviating or reducing a step difference generated by the configurations of the pixel circuit PXC positioned thereunder in the pixel circuit layer PCL.

In one or more embodiments, the pixel circuit layer PCL may include at least one conductive layer provided between the above-described insulating layers. For example, the pixel circuit layer PCL may include a first conductive layer provided between the substrate SUB and the buffer layer BFL, a second conductive layer provided on the gate insulating layer GI, and a third conductive layer provided on the interlayer insulating layer ILD. For example, the first conductive layer may form a single layer formed of a material selected from a group consisting of copper (Cu), molybdenum (Mo), tungsten (W), aluminum neodymium (AlNd), titanium (Ti), aluminum (Al), silver (Ag), alloys thereof, and mixtures thereof, or may be formed as double layers or multiple layers of molybdenum (Mo), titanium (Ti), copper (Cu), aluminum (Al) and/or silver (Ag), which are low-resistance materials to reduce a line resistance. Each of the second and third conductive layers may include the same material as the first conductive layer or one or more suitable materials selected from the materials exemplified as a configuration material of the first conductive layer.

In one or more embodiments, the substrate SUB may include a transparent insulating material to allow light to pass therethrough. The substrate SUB may be a rigid substrate or a flexible substrate. The rigid substrate may be one of a glass substrate, a quartz substrate, a glass ceramic substrate, and a crystalline glass substrate. The flexible substrate may be one of a film substrate including a polymer organic material and a plastic substrate. For example, the flexible substrate may include at least one of polystyrene, polyvinyl alcohol, polymethyl methacrylate, polyethersulfone, polyacrylate, polyetherimide, polyethylene naphthalate, polyethylene terephthalate, polyphenylene sulfide, polyarylate, polyimide, polycarbonate, triacetate cellulose, and cellulose acetate propionate.

In one or more embodiments, the pixel circuit PXC may include at least one transistor T. The transistor T may be a driving transistor controlling the driving current of the light emitting element LD, and may have the same configuration as the first transistor T1 described with reference to FIG. 5.

In one or more embodiments, the transistor T may include a semiconductor pattern SCP, a gate electrode GE overlapping a portion of the semiconductor pattern SCP, and source and drain electrodes SE and DE connected to the semiconductor pattern SCP.

In one or more embodiments, the gate electrode GE may be provided and/or formed on the gate insulating layer GI. For example, the gate electrode GE may be the second conductive layer positioned between the gate insulating layer GI and the interlayer insulating layer ILD. The gate electrode GE may overlap a portion of the semiconductor pattern SCP. For example, the gate electrode GE may overlap an active pattern of the semiconductor pattern SCP.

In one or more embodiments, the semiconductor pattern SCP may be provided and/or formed on the buffer layer BFL. The semiconductor pattern SCP may be positioned between the buffer layer BFL and the gate insulating layer GI. The semiconductor pattern SCP may be a semiconductor layer formed of polysilicon, amorphous silicon, an oxide semiconductor, and/or the like. The semiconductor pattern SCP may include an active pattern, a first contact area, and a second contact area. The active pattern, the first contact area, and the second contact area may be formed of a semiconductor layer that is not doped with an impurity or doped with an impurity. For example, the first contact area and the second contact area may be formed of a semiconductor layer doped with an impurity, and the active pattern may be formed of a semiconductor layer that is not doped with an impurity. As an impurity, for example, an n-type impurity may be used, but is not limited thereto.

In one or more embodiments, the active pattern of the semiconductor pattern SCP may be an area overlapping the gate electrode GE of the transistor T, and may be a channel area. The first contact area of the semiconductor pattern SCP may be in contact with one end of the active pattern. In some embodiments, the first contact area may be connected to a source electrode SE. The second contact area of the semiconductor pattern SCP may contact another end of the active pattern. The second contact area may be connected to a drain electrode DE.

In one or more embodiments, the source electrode SE may be the third conductive layer provided and/or formed on the interlayer insulating layer ILD. The source electrode SE may contact the first contact area of the semiconductor pattern SCP through a contact hole passing through the gate insulating layer GI and the interlayer insulating layer ILD.

In one or more embodiments, the drain electrode DE may be the third conductive layer provided and/or formed on the interlayer insulating layer ILD. The drain electrode DE may be provided on the interlayer insulating layer ILD to be spaced apart from the source electrode SE. The drain electrode DE may contact the second contact area of the semiconductor pattern SCP through a contact hole passing through the gate insulating layer GI and the interlayer insulating layer ILD.

In one or more embodiments, a lower metal pattern BML may be provided under the transistor T. The lower metal pattern BML may be the first conductive layer positioned between the substrate SUB and the buffer layer BFL. The lower metal pattern BML may be electrically connected to the transistor T. In this case, a driving range of a set or predetermined voltage supplied to the gate electrode GE of the transistor T may be widened. In one or more embodiments, the lower metal pattern BML may be electrically connected to the semiconductor pattern SCP of the transistor T to stabilize the channel area of the transistor T. In addition, as the lower metal pattern BML is electrically connected to the transistor T, floating of the lower metal pattern BML may be prevented or reduced.

In the above-described embodiment, a case in which the transistor T is a thin film transistor having a top gate structure is described as an example, but the disclosure is not limited thereto, and a structure of the transistor T may be variously suitably changed.

In one or more embodiments, the display element layer DPL may be formed on the via layer VIA.

In one or more embodiments, the display element layer DPL of each pixel PXL may include the dummy electrode DME, the second connection electrode CNE2, the light emitting element LD, the first pixel electrode PE1 and the second pixel electrode PE2 provided in the emission area EMA.

In one or more embodiments, the display element layer DPL may further include insulating patterns and/or an insulating layer sequentially provided on one surface of the pixel circuit layer PCL. For example, the display element layer DPL may further include a bank pattern BNP, a first insulating layer INS1, a second insulating layer INS2, and a third insulating layer INS3.

In one or more embodiments, the bank pattern BNP may be provided and/or formed on the via layer VIA of the pixel circuit layer PCL. For example, the bank pattern BNP may include a support member and/or a wall pattern. In one or more embodiments, the bank pattern BNP may be formed as a separate pattern that is individually provided under the second connection electrode CNE2 and the dummy electrode DME to overlap a portion of the second connection electrode CNE2 and the dummy electrode DME.

In one or more embodiments, the bank pattern BNP may have an opening or a concave portion corresponding to areas between the second connection electrode CNE2 and the dummy electrode DME in the emission area EMA, and may be formed as an integral pattern entirely connected in the display area DA.

In one or more embodiments, the bank pattern BNP may protrude upward in the third direction DR3 on one surface of the pixel circuit layer PCL. One area of each of the second connection electrode CNE2 and the dummy electrode DME provided on the bank pattern BNP may protrude in the third direction DR3 (or a thickness direction of the substrate SUB).

In one or more embodiments, the bank pattern BNP may be an inorganic layer including an inorganic material or an organic layer including an organic material. According to one or more embodiments, the bank pattern BNP may include an organic layer of a single layer and/or an inorganic layer of a single layer, but is not limited thereto. According to one or more embodiments, the bank pattern BNP may be provided in a form of multiple layers in which at least one organic layer and at least one inorganic layer are stacked. However, a material of the bank pattern BNP is not limited to the above-described embodiment, and according to one or more embodiments, the bank pattern BNP may include any suitable conductive material (or substance). A shape of the bank pattern BNP may be variously suitably changed within a range capable of improving efficiency of light emitted from the light emitting element LD.

In one or more embodiments, the bank pattern BNP may be utilized as a reflective member. For example, the bank pattern BNP may be utilized as a reflective member for improving light output efficiency of the pixel PXL by guiding the light emitted from the light emitting element LD provided thereon in a desired direction.

In one or more embodiments, the second connection electrode CNE2 and the dummy electrode DME may be provided and/or formed on the bank pattern BNP.

In one or more embodiments, the second connection electrode CNE2 and the dummy electrode DME may be provided to be spaced apart from each other and may be provided on the same plane. For example, the dummy electrode DME may be provided in a center of the emission area EMA, and two second connection electrodes CNE2 may be provided on both sides of the dummy electrode DME.

In one or more embodiments, the first insulating layer INS1 may be provided on the second connection electrode CNE2 and the dummy electrode DME.

In one or more embodiments, the first insulating layer INS1 may be entirely provided and/or formed on the second connection electrode CNE2 and the dummy electrode DME. The first insulating layer INS1 may be partially opened to expose configurations positioned thereunder in the non-emission area NEA. For example, the first insulating layer INS1 may include the first contact hole (for example, the first contact hole CH1 of FIG. 6) for electrically connecting the first pixel electrode (for example, the first pixel electrode PE1 of FIG. 6) and the first connection electrode CNE1, and the second contact hole (for example, the second contact hole CH2 of FIG. 6) for electrically connecting the second pixel electrode PE2 and the second connection electrode CNE2.

In one or more embodiments, the second insulating layer INS2 may be provided and/or formed on each of the first and second light emitting elements LD1 and LD2. The second insulating layer INS2 may be positioned on the first and second light emitting elements LD1 and LD2 to partially cover an outer circumferential surface (or surface) of each of the first and second light emitting elements LD1 and LD2 and expose the first end EP1 and the second end EP2 of each of the first and second light emitting elements LD1 and LD2 to the outside. In some embodiments, the second insulating layer INS2 may be formed on the first insulating layer INS1 at least in the non-emission area NEA and may be partially opened to expose a partial configuration positioned thereunder.

In one or more embodiments, by forming the second insulating layer INS2 on the first and second light emitting elements LD1 and LD2, separation of the first and second light emitting elements LD1 and LD2 from their aligned positions may be prevented or reduced.

In one or more embodiments, the second insulating layer INS2 may include an inorganic insulating layer including an inorganic material, or an organic insulating layer. For example, the second insulating layer INS2 may include an inorganic insulating layer suitable for protecting the active layers (for example, the active layer 12 of FIG. 2) of each of the first and second light emitting elements LD1 and LD2 from external oxygen, moisture, and/or the like. However, the disclosure is not limited thereto, and the second insulating layer INS2 may be formed of an organic insulating layer including an organic material according to a design condition and/or the like of a display device to which the first and second light emitting elements LD1 and LD2 are applied. The second insulating layer INS2 may be configured as a single layer or multiple layers.

In one or more embodiments, the intermediate electrode CTE may be formed first on the second insulating layer INS2. The intermediate electrode CTE may be in direct contact with the second end EP2 of the first light emitting elements LD1 and the first end EP1 of the second light emitting elements LD2 so as to be connected between the first light emitting elements LD1 and the second light emitting elements LD2. Thereafter, the third insulating layer INS3 may be formed in the emission area EMA to cover the intermediate electrode CTE.

In one or more embodiments, the third insulating layer INS3 may be provided on the intermediate electrode CTE to cover the intermediate electrode CTE (or to prevent or reduce exposure of the intermediate electrode CTE to the outside), thereby preventing or reducing corrosion and/or the like of the intermediate electrode CTE. In some embodiments, the third insulating layer INS3 may be partially opened to expose configurations positioned thereunder.

In one or more embodiments, the third insulating layer INS3 may include an inorganic insulating layer formed of an inorganic material or an organic insulating layer formed of an organic material. For example, the third insulating layer INS3 may include at least one of inorganic materials containing a metal oxide such as silicon nitride ($SiN_x$), silicon oxide ($SiO_x$), silicon oxynitride ($SiO_xN_y$), and/or aluminum oxide ($AlO_x$), but is not limited thereto. In some embodiments, the third insulating layer INS3 may be formed as a single layer or a multilayer.

In one or more embodiments, the first pixel electrode PE1, the intermediate electrode CTE, and the second pixel electrode PE2 may be provided on the same layer of the display element layer DPL. For example, the first pixel electrode PE1, the second pixel electrode PE2, and the intermediate electrode CTE may be provided on the first insulating layer INS1.

In one or more embodiments, the first pixel electrode PE1, the intermediate electrode CTE, and the second pixel electrode PE2 may be formed simultaneously (or concurrently) or sequentially. In this case, the third insulating layer INS3 may not be provided.

In one or more embodiments, the first pixel electrode PE1, the second pixel electrode PE2, and the intermediate electrode CTE may be formed of one or more suitable transparent conductive materials to allow the light emitted from each of the light emitting elements LD to proceed in an image display direction (for example, the third direction DR3) of the display device DD without loss. For example, the first pixel electrode PE1, the second pixel electrode PE2, and the intermediate electrode CTE may include at least one of suitable transparent conductive materials (or substances) including indium tin oxide (ITO), indium zinc oxide (IZO), zinc oxide ($ZnO_x$), indium gallium zinc oxide (IGZO), indium tin zinc oxide (ITZO), and/or the like, and may be configured to be substantially transparent or translucent to satisfy a set or predetermined light transmittance (or transmittance). However, a material of the first pixel electrode PE1, the second pixel electrode PE2, and the intermediate electrode CTE is not limited to the above-described embodiment. According to one or more embodiments, the first pixel electrode PE1, the second pixel electrode PE2, and the intermediate electrode CTE may be formed of one or more suitable opaque conductive materials (or substances). The first pixel electrode PE1, the second pixel electrode PE2, and the intermediate electrode CTE may be formed as a single layer or multiple layers.

In one or more embodiments, an overcoat layer (for example, a layer for planarizing (or substantially planarizing) an upper surface of the display element layer DPL) of at least one layer may be further provided on the intermediate electrode CTE and the second pixel electrode PE2.

In one or more other embodiments, an optical layer (e.g., the optical layer LCL in FIG. 4) may be selectively provided on the display element layer DPL of each pixel PXL. As an example, the optical layer LCL may further include a color conversion layer including color conversion particles that convert the light emitted from the light emitting element LD into light of a specific color.

In one or more embodiments, the bank BNK may be provided in the non-emission area NEA to define the emission area EMA of each adjacent pixel PXL.

FIG. 9 illustrates a cross-sectional view taken along a line B-B' of FIG. 6 according to one or more embodiments.

In one or more embodiments, the via layer VIA may be partially opened to include the third contact hole CH3 for exposing one area of a bridge conductive pattern BRP1. For example, the bridge conductive pattern BRP1 may be the first power line PL1 to which the first driving power VDD is applied. For example, the first connection electrode CNE1 may be provided on the via layer VIA, and the first connection electrode CNE1 may be connected to the via layer VIA through the third contact hole CH3. For example, the first connection electrode CNE1 may be electrically connected to the bridge conductive pattern BRP1 through the third contact hole CH3. For example, the first connection electrode CNE1 may receive the first driving power VDD through the bridge conductive pattern BRP1 connected through the third contact hole CH3.

For example, the first insulating layer INS1 may be provided on the first connection electrode CNE1. The first insulating layer INS1 may include the first contact hole CH1 for connecting the first connection electrode CNE1 and the first pixel electrode PE1. The first pixel electrode PE1 may be electrically connected to the first connection electrode CNE1 through the first contact hole CH1 formed in the first insulating layer INS1.

In one or more embodiments, the dummy electrode DME may be provided on the via layer VIA, and may be provided to be spaced apart from the first connection electrode CNE1. For example, the first pixel electrode PE1 may not be electrically connected to the dummy electrode DME. For example, the dummy electrode DME may have an island shape which is not connected to other conductive layers (or conductive patterns) (for example, in a floating state).

In one or more embodiments, the dummy electrode DME may not be physically and/or electrically connected to the first pixel electrode PE1. Furthermore, in one or more embodiments, the dummy electrode DME is not electrically/physically connected to any other signal line or electrodes. For example, the first pixel electrode PE1 and the intermediate electrode CTE may be formed on the dummy electrode DME, but the dummy electrode DME is not electrically connected to the first pixel electrode PE1 and the intermediate electrode CTE. Therefore, a potential difference may not be formed between the first pixel electrode PE1 and the dummy electrode DME and between the intermediate electrode CTE and the dummy electrode DME, and acceleration of a galvanic phenomenon of the first pixel electrode PE1 and the intermediate electrode CTE according to the potential difference between the first pixel electrode PE1 and the dummy electrode DME and between the intermediate electrode CTE and the dummy electrode DME may be prevented or reduced.

In addition, because a direct connection between the dummy electrode DME and the first pixel electrode PE1 is blocked (e.g., does not exist), the flow of moisture and/or a particle (e.g., impurity) into the first pixel electrode PE1 through the first insulating layer INS1 connected to the dummy electrode DME may be prevented or reduced, and thus corrosion of the first pixel electrode PE1 may be prevented or reduced.

Although the disclosure has been described with reference to the embodiments thereof, those skilled in the art will understand that the disclosure may be variously suitably corrected and changed within a range without departing from the spirit and scope of the disclosure disclosed in the claims and their equivalents.

What is claimed is:

1. A display device comprising:
a substrate comprising an emission area and a non-emission area;
a first connection electrode on the substrate and electrically connected to a first driving power;
a second connection electrode spaced apart from the first connection electrode in a first direction and electrically connected to a second driving power;
a dummy electrode spaced apart from the first connection electrode in a second direction crossing the first direction;
light emitting elements between the second connection electrode and the dummy electrode in a plan view, the light emitting elements forming the emission area;
a first pixel electrode on the first connection electrode and the dummy electrode and electrically connected to the first connection electrode; and
a second pixel electrode on the second connection electrode and electrically connected to the second connection electrode,
wherein the first connection electrode does not overlap the second connection electrode in the second direction, and
wherein the dummy electrode does not overlap the second connection electrode in the second direction.

2. The display device according to claim 1, wherein the light emitting elements do not overlap the first connection electrode.

3. The display device according to claim 1, wherein the first connection electrode is in the non-emission area of the substrate.

4. The display device according to claim 1, wherein the first connection electrode, the second connection electrode, and the dummy electrode are on the same layer.

5. The display device according to claim 1, wherein the dummy electrode overlaps the first pixel electrode and is not electrically connected to the first pixel electrode or the second pixel electrode.

6. The display device according to claim 1, wherein a cross-sectional area of the dummy electrode in a direction perpendicular to a light emission direction of the light emitting elements is greater than a cross-sectional area of the first connection electrode in the same direction.

7. The display device according to claim 1, further comprising:
an intermediate electrode spaced apart from the first pixel electrode and the second pixel electrode.

8. The display device according to claim 7, wherein the dummy electrode overlaps the first pixel electrode and the intermediate electrode.

9. The display device according to claim 7, wherein the first pixel electrode, the second pixel electrode, and the intermediate electrode are on the same layer.

10. The display device according to claim 9, wherein the intermediate electrode surrounds a portion of the first pixel electrode in a plan view.

11. The display device according to claim 7, wherein the light emitting elements comprise first light emitting elements and second light emitting elements, the first light emitting elements being connected to the second light emitting elements in series.

12. The display device according to claim 11, wherein a first end of the first light emitting elements is in contact with the first pixel electrode, a second end of the first light emitting elements is in contact with the intermediate electrode,
a first end of the second light emitting elements is in contact with the intermediate electrode, and a second end of the second light emitting elements is in contact with the second pixel electrode.

13. The display device according to claim 1, further comprising:
an insulating layer between the first pixel electrode and the second pixel electrode, and between the first connection electrode and the second connection electrode,
wherein the first pixel electrode and the first connection electrode are electrically connected to each other through a first contact hole formed in the insulating layer.

14. The display device according to claim 13, wherein the second pixel electrode and the second connection electrode are electrically connected to each other through a second contact hole formed in the insulating layer.

15. The display device according to claim 1, further comprising:
a conductive layer comprising the first connection electrode, the second connection electrode, and the dummy electrode, and a via layer between the conductive layer and the substrate,
wherein the first connection electrode is electrically connected to a first power line configured to provide a voltage of the first driving power through a first via hole formed in the via layer.

16. The display device according to claim 15, wherein the second connection electrode is electrically connected to a second power line configured to provide a voltage of the second driving power through a second via hole formed in the via layer.

17. The display device according to claim 16, wherein the first power line extends in the second direction, and
the second power line extends in the first direction in the non-emission area.

* * * * *